(12) United States Patent
Kim et al.

(10) Patent No.: US 11,466,378 B2
(45) Date of Patent: Oct. 11, 2022

(54) ELECTROPLATING APPARATUS AND ELECTROPLATING METHOD USING THE SAME

(71) Applicant: LG Display Co., Ltd., Seoul (KR)

(72) Inventors: Gotae Kim, Seoul (KR); ByeongSun Yoo, Goyang-si (KR); ByungChul Ahn, Seoul (KR); WooChan Kim, Goyang-si (KR); JuYoung Jeong, Paju-si (KR); SangCheol Moon, Paju-si (KR); Wook Kim, Paju-si (KR); Changjun Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 176 days.

(21) Appl. No.: 16/732,099

(22) Filed: Dec. 31, 2019

(65) Prior Publication Data

US 2020/0208289 A1    Jul. 2, 2020

(30) Foreign Application Priority Data

Dec. 31, 2018  (KR) .......................... 10-2018-0173578

(51) Int. Cl.
| | |
|---|---|
| *C25D 5/04* | (2006.01) |
| *C25D 5/02* | (2006.01) |
| *C25D 17/10* | (2006.01) |
| *H01L 51/56* | (2006.01) |
| *H01L 51/00* | (2006.01) |
| *C25D 17/06* | (2006.01) |

(52) U.S. Cl.
CPC .............. *C25D 5/022* (2013.01); *C25D 5/04* (2013.01); *C25D 17/06* (2013.01); *C25D 17/10* (2013.01); *H01L 51/001* (2013.01); *H01L 51/0011* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 3,862,891 A | 1/1975 | Smith | |
| 4,304,641 A * | 12/1981 | Grandia | ................... C25D 5/08 205/96 |

(Continued)

FOREIGN PATENT DOCUMENTS

| | | |
|---|---|---|
| CN | 1051205 A | 5/1991 |
| CN | 101448983 A | 6/2009 |

(Continued)

*Primary Examiner* — Stefanie S Wittenberg
(74) *Attorney, Agent, or Firm* — Seed IP Law Group LLP

(57) ABSTRACT

Electroplating apparatus and electroplating method using the same. Provided is an electroplating apparatus. The electroplating apparatus includes a plating bath and a stage configured to support a substrate loaded into the plating bath to be disposed in a horizontal direction. The electroplating apparatus further includes a plurality of cathodes disposed on both sides of the substrate and an anode configured to be movable above the substrate. The electroplating apparatus also includes a plurality of spray nozzles disposed on at least one side of the anode and configured to spray a plating solution. The electroplating apparatus further includes a shield which is disposed on both sides of the anode and whose one end is more adjacent to the substrate than the anode.

18 Claims, 16 Drawing Sheets

(56) References Cited

U.S. PATENT DOCUMENTS

| | | | | |
|---|---|---|---|---|
| 4,359,375 A | * | 11/1982 | Smith | C25D 17/12 204/212 |
| 5,188,720 A | | 2/1993 | Colin et al. | |
| 5,744,013 A | | 4/1998 | Botts et al. | |
| 7,136,173 B2 | * | 11/2006 | Wang | B24B 37/013 356/636 |
| 2002/0008036 A1 | * | 1/2002 | Wang | H01L 21/4846 205/133 |
| 2003/0132118 A1 | | 7/2003 | Kovarsky | |
| 2010/0006445 A1 | | 1/2010 | Tomantschger | |
| 2014/0190835 A1 | | 7/2014 | Kojima et al. | |
| 2015/0096895 A1 | * | 4/2015 | Britz | C25D 17/005 205/291 |
| 2018/0291521 A1 | | 10/2018 | Tsuji et al. | |

FOREIGN PATENT DOCUMENTS

| | | | | |
|---|---|---|---|---|
| CN | 103911639 A | | 7/2014 | |
| CN | 104024490 A | | 9/2014 | |
| CN | 108342756 A | | 7/2018 | |
| CN | 108950664 A | | 12/2018 | |
| KR | 10-2014-0087649 A | | 7/2014 | |
| KR | 20170037066 | * | 4/2017 | ............. C25D 17/00 |
| KR | 20180000133 | * | 1/2018 | ............. C25D 17/06 |

* cited by examiner

ELECTROPLATING APPARATUS AND ELECTROPLATING METHOD USING THE SAME

CROSS-REFERENCE TO RELATED APPLICATIONS

This application claims the priority of Korean Patent Application No. 10-2018-0173578 filed on Dec. 31, 2018, in the Korean Intellectual Property Office, the disclosure of which is incorporated herein by reference.

BACKGROUND

Technical Field

The present disclosure relates to an electroplating apparatus and an electroplating method using the same.

Description of the Related Art

Plating is used to increase the added-value of a final product by giving the surfaces of materials and parts functional properties such as corrosion resistance, durability, and conductivity or improving the appearance through physical, chemical, and electrochemical treatments. Thus, it is the core technology of the materials and parts industry. The plating can be roughly classified into wet plating that is performed in an aqueous solution and dry plating that is performed in the atmosphere and a vacuum state. Examples of the wet plating include electroplating, electroless plating, anodization, and chemical conversion treatment, and examples of the dry plating include hot dipping, thermal spraying, physical deposition, and chemical deposition. The wet plating has advantages such as high plating speed, high economic feasibility, easiness of adding various functional properties, and convenience for continuous process and mass production. Therefore, the wet plating is a technology which has grown and will continue to grow.

BRIEF SUMMARY

The inventors of the present disclosure used such a plating process and developed a process for forming a mask, e.g., a fine metal mask (FMM), used when manufacturing an organic light emitting display device.

An organic layer of the organic light emitting display device may have a patterned emission layer structure according to a design. In the organic light emitting display device having the patterned emission layer structure, emission layers emitting light of different colors are separated for respective pixels.

For example, a red organic emission layer for emitting red light, a green organic emission layer for emitting green light, and blue organic emission layer for emitting blue light may be separated in a red sub-pixel, a green sub-pixel, and a blue sub-pixel, respectively. The organic emission layers may be deposited and patterned on emission regions of the respective sub-pixels using a mask, e.g., FMM, having openings for the respective sub-pixels.

Such a mask has been typically manufactured by forming a pattern through exposure and development and then transferring the pattern on a metal sheet through wet-etching. However, when the mask is manufactured using the wet-etching process, it is difficult to precisely control the pattern width during the etching process due to the isotropy of etching. Therefore, it is difficult to obtain a high-resolution pattern.

Accordingly, the inventors of the present disclosure invented a method for manufacturing a mask using a wet-plating process instead of the above-described etching process.

As a conventional wet-plating process, a vertical plating method in which plating is performed in a state where a substrate is disposed vertically within a plating bath has been widely used. According to the vertical plating method, a substrate is disposed vertically on the bottom of a plating bath within the plating bath. When the plating bath is filled with a plating solution, plating is performed in a state where the surface of the plating solution is disposed vertically to the substrate. When plating is performed by the vertical plating method, a cathode is connected to one side of a seed pattern on the substrate and an anode is disposed on the plating solution.

The inventors of the present disclosure found that various problems may occur when using the vertical plating method. For example, according to the vertical plating method, the cathode is connected to the seed pattern on only one side of the substrate, the cathode and the seed pattern are in contact at a single point. Thus, a resistance of the seed pattern increases as being away from a contact portion between the cathode and the seed pattern. Therefore, according to the vertical plating method, it is very difficult to form a uniform plating layer on the entire substrate. Further, according to the vertical plating method, the substrate is disposed in a vertical direction. Thus, a gas such as hydrogen and a by-product such as salt generated during the plating process may be accumulated in the vertical direction. That is, obstacles to plating may be accumulated. Furthermore, according to the vertical plating method, the substrate being transferred in a horizontal direction needs to be rotated to the vertical direction in order to load the substrate into the plating bath. After the plated substrate is unloaded from the plating bath, the substrate needs to be rotated again to the horizontal direction. Therefore, the plating bath and its peripheral devices become bulky.

Accordingly, the inventors of the present disclosure recognized the above-described problems of the vertical plating method. Then, the inventors of the present disclosure invented an electroplating apparatus that performs plating using a horizontal plating method and a method for manufacturing the electroplating apparatus.

The present disclosure provides an electroplating apparatus that performs plating using a horizontal plating method to maintain a constant resistance of a seed pattern on a substrate and a method for manufacturing the electroplating apparatus.

Further, the present disclosure provides an electroplating apparatus that performs plating using a horizontal plating method to reduce or minimize the accumulation of obstacles such as a gas or by-product generated during the plating process and a method for manufacturing the electroplating apparatus.

In addition, the present disclosure provides an electroplating apparatus that performs plating using a horizontal plating method to implement a reduced or minimized volume of a plating system and a method for manufacturing the electroplating apparatus.

The present disclosure further provides an electroplating apparatus that can apply different current densities to respective plating regions by dividing a cathode connected to a seed pattern on a substrate into a plurality of parts and a method for manufacturing the electroplating apparatus.

Moreover, the present disclosure provides an electroplating apparatus that can regulate a current density under an anode by placing a shield on a lateral side of the anode and a method for manufacturing the electroplating apparatus.

The present disclosure further provides an electroplating apparatus that can form a plating layer with a uniform thickness and a uniform composition ratio and a method for manufacturing the electroplating apparatus.

The present disclosure further provides an electroplating apparatus that can improve the degree of uniformity in the flow velocity of a plating solution in a plating region under an anode and a method for manufacturing the electroplating apparatus.

Advantages of the present disclosure are not limited to the above, and other advantages, which are not mentioned above, can be clearly understood by those skilled in the art from the following descriptions.

According to an aspect of the present disclosure, an electroplating apparatus includes a plating bath having a first side and a second side opposite the first side and one or more stages extending from the first side to the second side of the plating bath, the stages being configured to support a substrate loaded into the plating bath. The electroplating apparatus further includes a plurality of cathodes disposed on both the first and second sides of the plating bath and an anode configured to be movable above the plating bath. The electroplating apparatus also includes a plurality of spray nozzles disposed on at least one side of the anode and configured to spray a plating solution. The electroplating apparatus further includes a shield adjacent to the plurality of spray nozzles being disposed on the at least one side of the anode and whose one end is more adjacent to the substrate than the anode.

According to another aspect of the present disclosure, a horizontal electroplating apparatus includes a plating bath that provides a space where a plating solution is filled. The horizontal electroplating apparatus further includes a plurality of first cathodes and a plurality of second cathodes disposed respectively facing each other within the plating bath. The horizontal electroplating apparatus also includes an anode arranged above the plating bath and configured to be movable between the plurality of first cathodes and the plurality of second cathodes. The horizontal electroplating apparatus further includes a shield disposed adjacent to the anode and configured to be movable together with the anode. The horizontal electroplating apparatus also includes a spray nozzle disposed at least between the anode and the shield or outside the shield and configured to be movable together with the anode and the shield.

According to yet another aspect of the present disclosure, a horizontal electroplating method includes placing a substrate including a seed pattern in a first direction within a plating bath. The horizontal electroplating method further includes fixing opposing first and second sides of the substrate using a plurality of cathodes and placing an anode above the substrate. The horizontal electroplating method also includes applying a current to the plurality of cathodes and the anode and depositing a plating layer on the substrate while moving the anode in the first direction. In some embodiments, the first direction is a horizontal direction.

Other detailed matters of the exemplary embodiments are included in the detailed description and the drawings.

According to the present disclosure, it is possible to solve the problems of a vertical plating method, such as the non-uniformity in resistance of a seed pattern, the production of by-products, a large volume of a manufacturing apparatus.

According to the present disclosure, a plurality of cathodes is disposed on both sides of a substrate and a voltage applied to cathodes located corresponding to each other can be regulated. Thus, the current density applied to each plating region can be regulated freely.

According to the present disclosure, it is possible to decrease a thickness distribution of a plating layer by regulating the distribution of current density under an anode. Also, it is possible to suppress an increase in a composition ratio of nickel forming the plating layer in both ends of the plating layer.

According to the present disclosure, it is possible to improve the degree of uniformity in the flow velocity of a plating solution between the anode and the substrate which is a plating target object.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
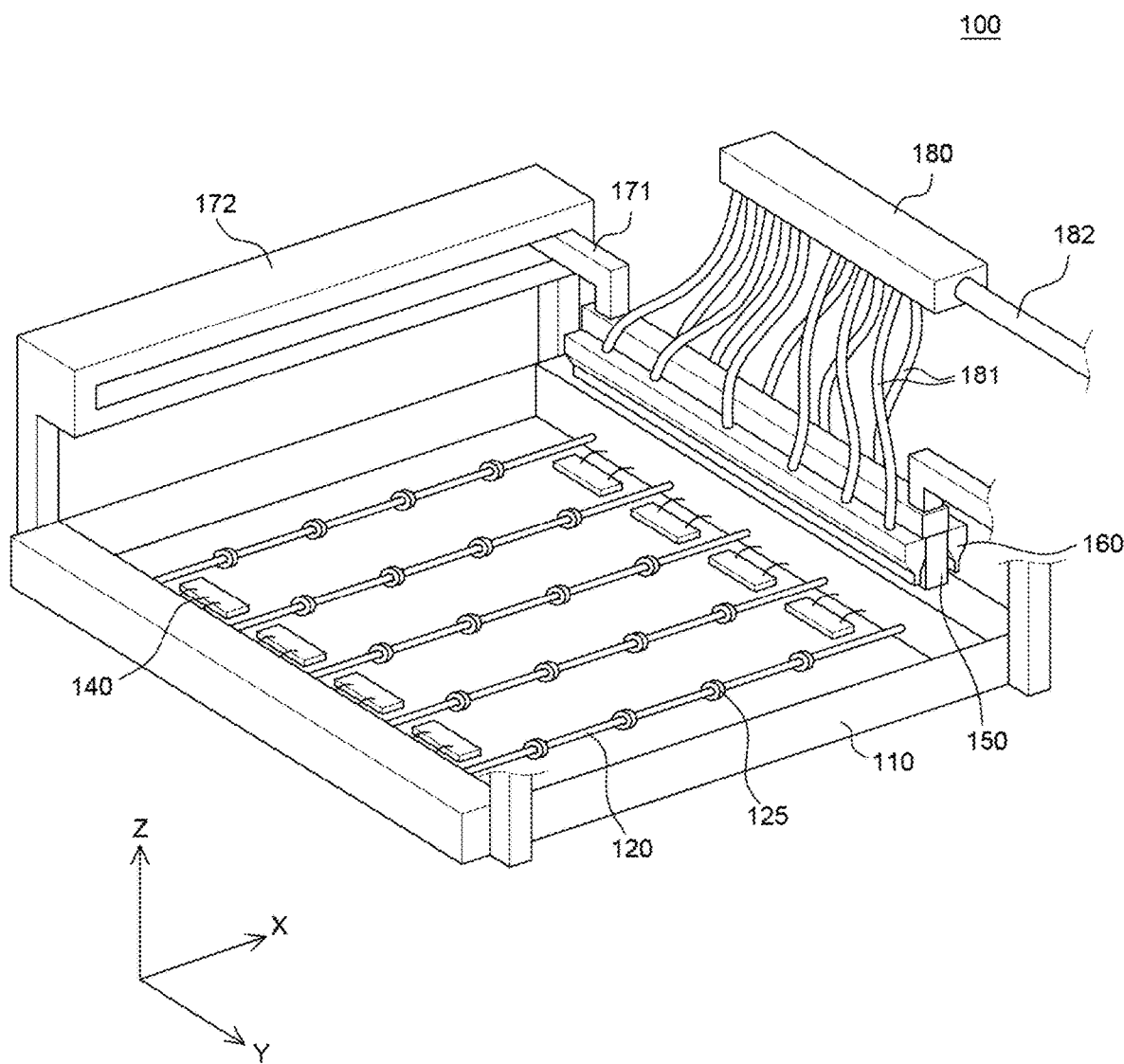
FIG. 1 is a schematic perspective view of an electroplating apparatus according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including" and "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, the element or layer may be disposed directly on the other element or layer, or another element or layer may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Electroplating Apparatus

Figure 2:
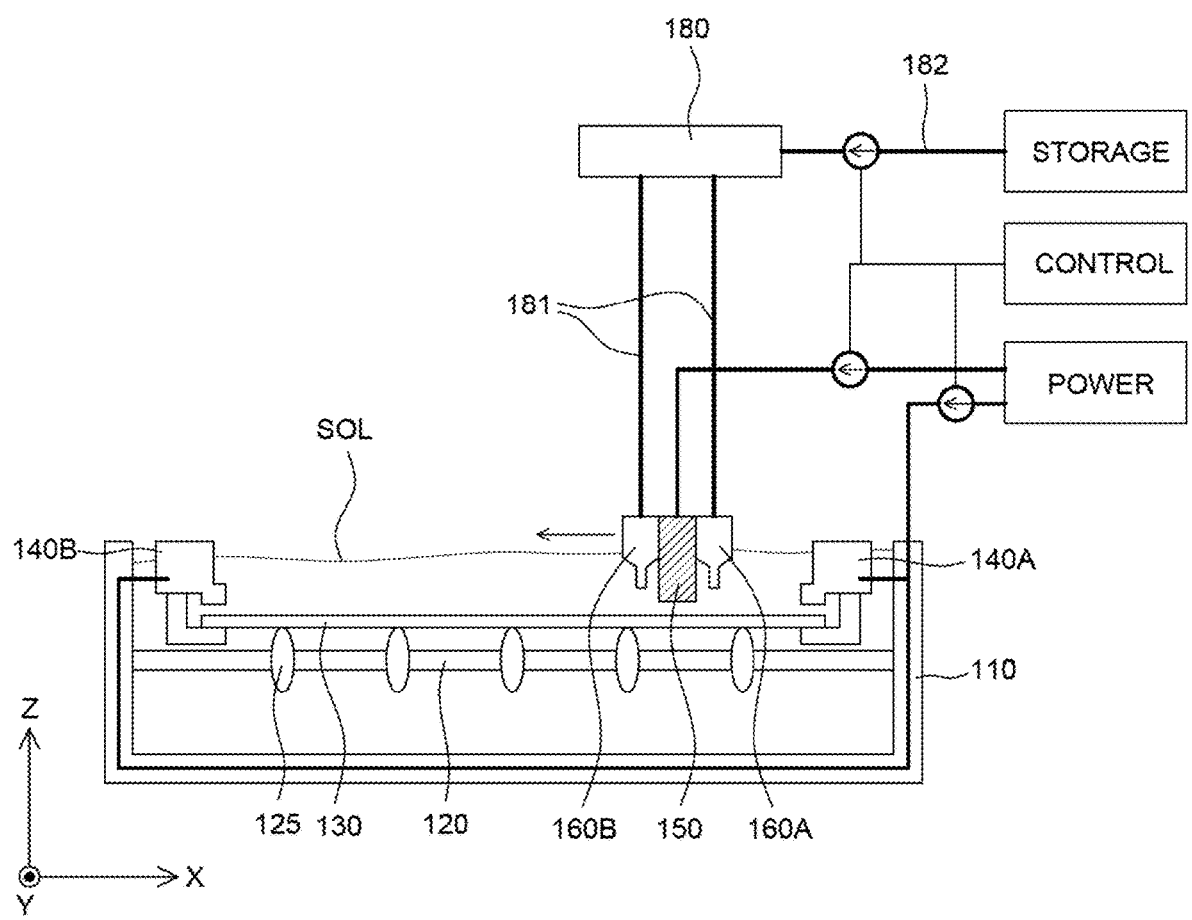
FIG. 2 is a schematic cross-sectional view as taken along an X-axis/Z-axis plane of FIG. 1.
Figure 3:
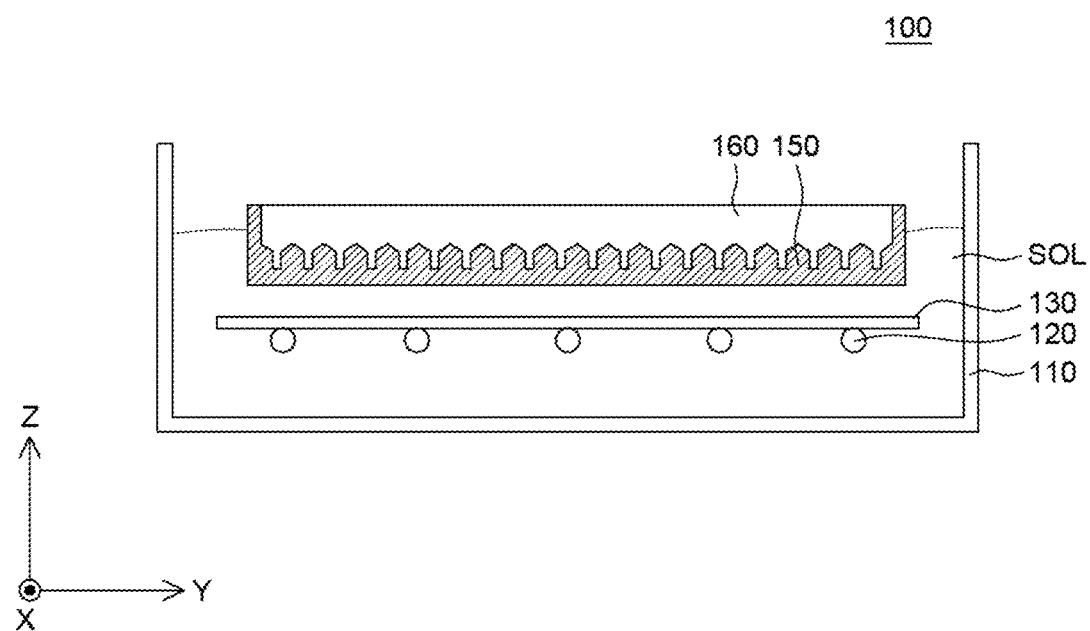
FIG. 3 is a schematic cross-sectional view as taken along a Y-axis/Z-axis plane of FIG. 1.
Figure 4:
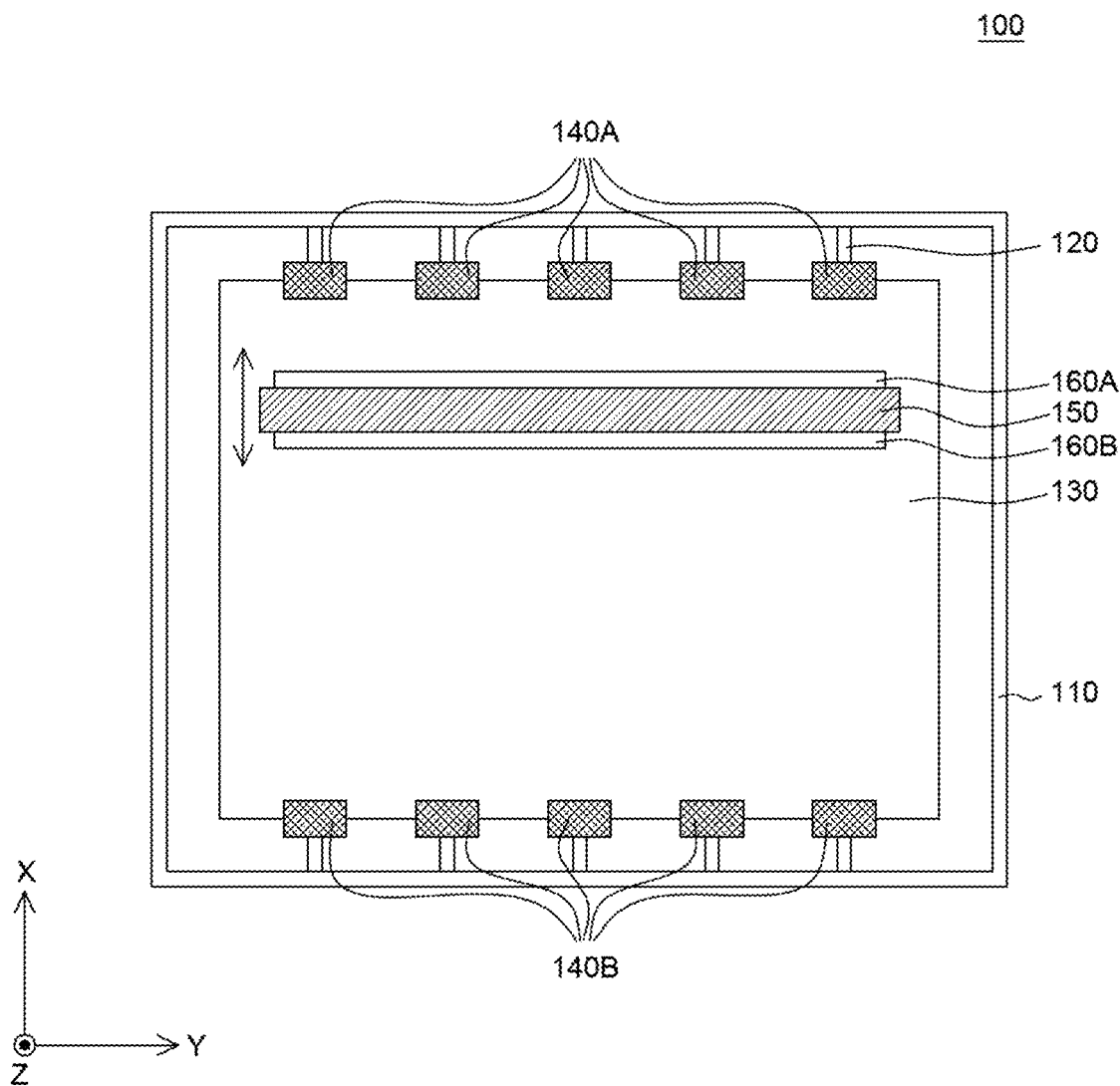
FIG. 4 is a schematic plan view of the electroplating apparatus according to an embodiment of the present disclosure.

FIG. 1 is a schematic perspective view of an electroplating apparatus according to an embodiment of the present disclosure. FIG. 2 is a schematic cross-sectional view as taken along an X-axis/Z-axis plane of FIG. 1. FIG. 3 is a schematic cross-sectional view as taken along a Y-axis/Z-axis plane of FIG. 1. FIG. 4 is a schematic plan view of the electroplating apparatus according to an embodiment of the present disclosure. Referring to FIG. 1 through FIG. 4, an electroplating apparatus 100 according to an embodiment of the present disclosure includes a plating bath 110, a stage 120, a substrate 130, a cathode 140, an anode 150, and a spray nozzle 160. The electroplating apparatus 100 further includes a connection unit 171, a driving unit 172, a plating solution transfer unit 180, a plating solution SOL, a plating solution storage STORAGE, a power supply unit POWER, and a controller CONTROL.

The plating bath 110 provides an inside space where a plating solution SOL is filled. In the plating bath 110, the substrate 130 on which a plating layer is to be formed is accommodated. Further, the plating bath 110 may have a spatial size where a sufficient amount of the plating solution SOL can be supplied to form a plating layer on the substrate 130 and a remaining plating solution can be discharged. The plating bath 110 may have a hexahedral shape with a top opening, but is not limited thereto.

The stage 120 is a stage configured to load the substrate 130, which is a plating target object, into the plating bath 110 and support the substrate 130 during a process of supplying the plating solution SOL. The stage 120 may be disposed within the plating bath 110 to maintain a consistent horizontality. For example, the stage 120 may be disposed in a horizontal direction (X-axis/Y-axis direction). Further, the stage 120 may be disposed such that a surface of the substrate 130 disposed on the stage 120 is parallel to a surface of the plating solution SOL. FIG. 2 and FIG. 3 illustrate that the surface of the plating solution SOL is fluid to indicate that the plating solution SOL is liquid, but the surface of the plating solution SOL may be substantially parallel to the bottom surface of the plating bath 110.

The stage 120 may be provided as a plurality of rod-shaped stages 120 spaced apart from each other in a specific direction as shown in FIG. 1. For example, the stage 120 includes a plurality of rods extended in the Y-axis direction, and the plurality of rods may be disposed parallel in the X-axis direction. In some embodiments, the plurality of rod-shaped stages 120 may be connected between two sides of the plating bath 110 that are facing each other. A plurality of cathodes 140 may also be connected between two sides of the plating bath 110 and the plurality of rod-shaped stages 120 may be arranged between adjacent cathodes 140. The stage 120 may be formed into a mesh shape or a plate shape, and accordingly, the present disclosure is not limited to a rod-shape stage.

Further, the stage 120 may include rollers 125 mounted on a plurality of shafts and films to transfer the substrate 130. When the plurality of shafts is rotated to transfer the substrate 130, the rollers 125 are rotated accordingly. As the rollers 125 are rotated, the stage 120 supports and transfers the substrate 130 disposed outside the plating bath 110 into the plating bath 110. When the substrate 130 reaches a position for plating, the shafts stop driving and the stage 120 functions to support the substrate 130. FIG. 1 illustrates the stage 120 in which four rollers 125 are mounted on each of five shafts. However, the present disclosure is not limited thereto. More stages 120 may be disposed to improve the flatness of the substrate 130.

The substrate 130 is a plating target object, and a plating layer is formed on the surface of the substrate 130 by the electroplating apparatus 100 according to an embodiment of the present disclosure. For example, a seed pattern functioning as a seed during a plating process is formed of a conductive material on the substrate 130. The substrate 130 including the seed pattern thereon is disposed on the stage 120. The substrate 130 is disposed in a horizontal direction within the plating bath 110. Thus, when the plating bath 110 is filled with the plating solution SOL, the surface of the substrate 130 may be disposed substantially parallel to the surface of the plating solution SOL. The substrate 130 may be a conductor or a nonconductor, but is not limited thereto. Herein, it has been described that the substrate 130 and the seed pattern are separate components, but the substrate 130 may include the seed pattern.

The cathode 140 is disposed on both sides of the substrate 130 to apply or supply a current to the substrate 130. For example, the cathode 140 may apply a current to the seed pattern disposed on the substrate 130. Thus, a plating layer may be formed on the surface of the substrate 130 by the flow of electricity between the cathode 140 and the anode 150. The cathode 140 may be disposed within the plating bath 110 and may be in contact with both sides of the substrate 130. Further, the cathode 140 on the both sides of the substrate 130 may also fix the substrate 130 so as not to move. For example, the cathode 140 may also be configured as a clamp to grasp both sides of the substrate 130. In some embodiments, if the substrate 130 can be fully fixed by the cathode 140, the stage 120 may not be provided.

The cathode 140 may be formed as a plurality of cathodes 140, and the plurality of cathodes 140 may be disposed corresponding to each other on both sides of the substrate 130. For example, the cathode 140 may include a plurality of first cathodes 140A and a plurality of second cathodes 140B disposed on the respective both sides of the substrate 130 based on the X-axis direction that is a movement direction of the anode 150. The plurality of first cathodes 140A is disposed on one side of the substrate 130 based on the X-axis direction. The plurality of second cathodes 140B is disposed on the other side of the substrate 130 based on the X-axis direction. Herein, the plurality of first cathodes 140A disposed on one side of the substrate 130 may be disposed respectively facing and corresponding to the plurality of second cathodes 140B disposed on the other side of the substrate 130. Therefore, the plurality of first cathodes 140A and the plurality of second cathodes 140B may be configured to apply different current densities to respective plating regions of the substrate 130.

The plurality of first cathodes 140A and the plurality of second cathodes 140B may be disposed parallel to the surface of the plating solution SOL within the plating bath 110. For example, a virtual plane on which the plurality of first cathodes 140A and the plurality of second cathodes 140B are disposed may be parallel to the surface of the plating solution SOL. Thus, the surface of the substrate 130 may be maintained parallel to the surface of the plating solution SOL by the plurality of cathodes 140 that fixes the substrate 130.

The anode 150 is spaced above the substrate 130 (or the plating bath 110 in which the substrate 130 is placed) and applies a current to the substrate 130. The anode 150 may be configured to move in the X-axis direction by the connection unit 171 and the driving unit 172. For example, the anode 150 may be configured to move between the plurality of first cathodes 140A and the plurality of second cathodes 140B. A plating layer is formed on an upper surface of the substrate 130 corresponding to a region where the anode 150 is located along the movement direction of the anode 150 by a current flowing between the anode 150 and the cathode 140. The anode 150 may be smaller in size than the substrate 130 which is a plating target object. In the horizontal electroplating apparatus, a plating layer may be formed on the substrate 130 while moving the anode 150 one or more times in the X-axis direction.

The anode 150 may have a rectangular parallelepiped shape. For example, the anode 150 may have a rectangular shape whose width along the X-axis direction as the movement direction of the anode 150 is smaller than a length along the Y-axis direction perpendicular to the X-axis direction. Further, the anode 150 may have a rectangular shape whose width along the X-axis direction as the movement direction of the anode 150 is smaller than a height along a Z-axis direction perpendicular to the X-axis and Y-axis directions. In other words, the anode 150 may have a rectangular shape whose X-axis directional width is smaller than the Y-axis directional length and the Z-axis directional height, but the shape of the anode 150 is not limited thereto and other shapes and sizes with various dimensions may be utilized.

The spray nozzle 160 sprays the plating solution SOL downwards toward the substrate 130. The spray nozzle 160 may be disposed adjacent to the anode 150. The spray nozzle 160 may be combined with the anode 150 and moved with the anode 150 in the X-axis direction. The spray nozzle 160 supplies the plating solution SOL from above the substrate 130. Thus, the spray nozzle 160 can support the circulation of the plating solution SOL within the plating bath 110 and maintain a constant concentration of the plating solution SOL.

The spray nozzle 160 may include a plurality of spray nozzles disposed in the Y-axis direction along the surface of the substrate 130. Since the plurality of spray nozzles 160 is used, the plating solution SOL can be rapidly supplied when electroplating is performed. Further, the spray nozzle 160 may be disposed on only one surface or on both surfaces of the anode 150 based on the X-axis direction that is the movement direction of the anode 150. For example, the spray nozzle 160 may include a plurality of first spray nozzles 160A disposed on one surface of the anode 150 and a plurality of second spray nozzles 160B disposed on the other surface of the anode 150 based on the X-axis direction that is the movement direction of the anode 150. Furthermore, the spray nozzle 160 may be rotatable with adjustable spraying direction and angle.

The connection unit 171 is disposed on the plating bath 110 and connected to the anode 150 and the spray nozzle 160. The connection unit 171 can fix the anode 150 and the spray nozzle 160 and adjust the Z-axis directional height of the anode 150 and the spray nozzle 160. The connection unit 171 may be moved by the driving unit 172 in the X-axis direction. The connection unit 171 may adjust the height of the spray nozzle 160 relative to the substrate 130 during a plating process to optimize a flow rate of the plating solution SOL and currents for respective regions of the substrate 130.

The driving unit 172 is combined with the connection unit 171 to reciprocate the connection unit 171 in the X-axis direction that is the movement direction of the anode 150. The driving unit 172 may be disposed on an edge of the plating bath 110. The driving unit 172 may move the connection unit 171 and also control the movement speed of the connection unit 171. Therefore, the driving unit 172 controls the movement speed of the anode 150 and the spray nozzle 160 to regulate the thickness and area of a plating layer to be formed on the substrate 130. In one or more embodiments, the driving unit 172 may be operated by electrical power or motor for providing movement to the anode 150 connected to the connection unit 171. Any suitable machinery for properly assisting the movement of the anode 150 (as well as other components connected to the anode 150 such as the spray nozzle 160, shield, or the like) during the electroplating process may be employed.

The plating solution SOL may fill in the plating bath 110. The plating solution SOL may contain various ions to be used for a plating process. A mask which is a product manufactured by using the electroplating apparatus and the electroplating method according to an embodiment of the present disclosure may be used to deposit an organic layer in a heated environment instead of at room temperature. Therefore, the mask may be formed of, e.g., Invar or the like. As such, if the electroplating apparatus uses Invar for plating, the plating solution SOL may be a mixture solution. The mixture solution may be composed of anhydrous nickel sulfate ($NiSO_4$), nickel ions using nickel chloride ($NiCl_2$) or the like, an iron ion source using anhydrous iron sulfate ($FeSO_4$) or the like, a pH regulator such as boric acid, polish, a stress reliever, and a stabilizer. However, the present disclosure is not limited thereto. Herein, it is assumed that the plating layer is formed of Invar, but a material of the plating layer is not limited thereto.

The plating solution storage STORAGE is a storage configured to store the plating solution SOL within the electroplating apparatus 100. The plating solution SOL in the plating solution storage STORAGE is sprayed toward the substrate 130 through a second plating solution transfer line 182, the plating solution transfer unit 180, a first plating solution transfer line 181, and the spray nozzle 160. The plating solution SOL starting from the plating solution storage STORAGE is supplied as branched in the plating solution transfer unit 180 into the plurality of spray nozzles 160 disposed in the Y-axis direction on the side of the anode 150. A pair of first plating solution transfer lines 181 may be disposed corresponding to the spray nozzles 160 disposed on both surfaces of the anode 150.

The power supply unit POWER is electrically connected to the cathode 140 and the anode 150 and supplies or applies a current. For example, the power supply unit POWER may apply a voltage to the cathode 140 and the anode 150 to allow a constant current to flow between the cathode 140 and the anode 150. Since the constant current flows between the cathode 140 and the anode 150, a plating layer uniform in thickness and surface profile may be formed.

The power supply unit POWER may apply a constant voltage such as a direct current (DC) voltage to the anode 150 and apply an alternating current (AC) voltage to the cathode 140. Herein, the AC voltage may have various waveforms such as a sine wave, a pulse wave, or a triangle wave. In this case, the power supply unit POWER may apply the same voltage to the first cathode 140A and the second cathode 140B disposed facing each other among the plurality of first cathodes 140A and the plurality of second cathodes 140B. In this case, as the anode 150 moves, a current flowing between the first cathode 140A and the anode 150 and a current flowing between the second cathode 140B and the anode 150 may be changed. However, the sum of the current flowing between the anode 150 and the first cathode 140A as well as the current flowing between the anode 150 and the second cathode 140B disposed facing the first cathode 140A may be constant.

The controller CONTROL is connected to the power supply unit POWER and controls currents applied from the power supply unit POWER to the cathode 140 and the anode 150. For example, the controller CONTROL may regulate current densities generated by the cathode 140 and the anode 150 to control the thickness and surface profile of a plating layer. In one or more embodiments, the controller CONTROL includes a processing circuitry such as a microprocessor, microcontroller, integrated circuit, chip, microchip or the like suitable for performing and executing the algorithms, steps of the controller CONTROL described herein.

For example, the controller CONTROL may regulate a current density to be applied to the cathode 140 depending on a position of the anode 150 moving between the first cathode 140A and the second cathode 140B disposed facing each other. The controller CONTROL may sense a position of the anode 150. Then, the controller CONTROL may regulate a voltage to be applied to the plurality of cathodes 140 or turn on/off the cathodes 140 based on the area of plating on the substrate 130 corresponding to the position of the anode 150. Otherwise, voltages to be applied to the plurality of cathodes 140 according to a change in position of the anode 150 may be stored in a memory of the controller CONTROL in advance. When the position of the anode 150 is changed, the controller CONTROL may regulate a voltage to be applied to the plurality of cathodes 140 or turn on/off the cathodes 140 based on the data stored in the memory. Thus, the controller CONTROL may regulate the amount of current to be applied to each plating region to regulate the amount and thickness of a plating layer to be formed on the plating region.

In the electroplating apparatus 100 according to an embodiment of the present disclosure, a constant current may flow between the cathode 140 and the anode 150, and, thus, a plating layer uniform in thickness and surface profile may be formed. A DC voltage may be applied to the anode 150 and an AC voltage may be applied to the cathode 140. In this case, to maintain a constant current between the anode 150 and the cathode 140, the controller CONTROL may regulate the intensity of a voltage applied to the first cathode 140A and the second cathode 140B facing each other. Thus, the sum of currents applied to the first cathode 140A and the second cathode 140B can be maintained constant.

Figure 5:
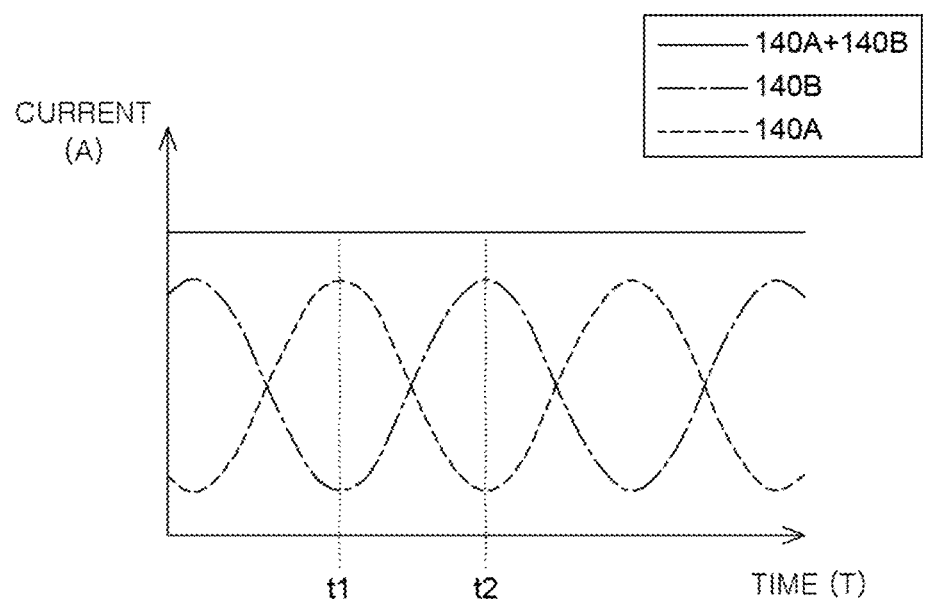
FIG. 5 is an exemplary graph provided to explain a current applied to a cathode of the electroplating apparatus according to an embodiment of the present disclosure.

FIG. 5 is an exemplary graph provided to explain a current applied to a cathode of the electroplating apparatus according to an embodiment of the present disclosure. For example, FIG. 5 illustrates currents applied through the first cathode 140A and the second cathode 140B facing each other.

Referring to FIG. 5, an AC voltage is applied to the first cathode 140A and the second cathode 140B. In this case, if the same voltage is applied to the first cathode 140A and the second cathode 140B, a current flowing between the first cathode 140A and the anode 150 and a current flowing between the second cathode 140B and the anode 150 may be changed as the anode 150 moves. However, since the same voltage is applied to the first cathode 140A and the second cathode 140B, the sum of the current flowing between the first cathode 140A and the anode 150 and the current flowing between the second cathode 140B and the anode 150 can be maintained constant.

More specifically, the same voltage may be applied to the first cathode 140A and the second cathode 140B. In this case, when the anode 150 is located closest to the first cathode 140A and farthest from the second cathode 140B (t1), a resistance between the first cathode 140A and the anode 150 is minimum. Thus, a current flowing between the first cathode 140A and the anode 150 is maximum. On the other hand, the anode 150 is located farthest from the second cathode 140B, and, thus, a resistance between the second cathode 140B and the anode 150 is maximum and a current flowing between the second cathode 140B and the anode 150 is minimum.

Then, as the anode 150 moves from the side of the first cathode 140A toward the side of the second cathode 140B, the resistance between the first cathode 140A and the anode 150 may gradually increase. Thus, the current flowing between the first cathode 140A and the anode 150 may gradually decrease.

Then, when the anode 150 is located closest to the second cathode 140B and farthest from the first cathode 140A (t2), the resistance between the second cathode 140B and the anode 150 is minimum. Thus, the current flowing between the second cathode 140B and the anode 150 is maximum. On the other hand, the anode 150 is located farthest from the first cathode 140A, the resistance between the first cathode 140A and the anode 150 is maximum and the current flowing between the first cathode 140A and the anode 150 is minimum.

Conventionally, the vertical electroplating method has been used for electroplating. According to the vertical electroplating method, a connection between a cathode and a seed pattern of a substrate is made on only one side of the substrate. Therefore, a contact between the cathode and the seed pattern is made at a single point. Thus, a resistance of the seed pattern increases as being away from a contact portion between the cathode and the seed pattern. Therefore, according to the vertical electroplating method, it is very difficult to form a uniform plating layer on the entire substrate. Further, according to the vertical electroplating method, the substrate is disposed in a vertical direction. Thus, a gas such as hydrogen and a by-product such as salt generated during the plating process may be accumulated in the vertical direction. That is, obstacles to plating may be accumulated. Furthermore, according to the vertical electroplating method, the substrate 130 being transferred in a horizontal direction needs to be rotated to the vertical direction in order to load the substrate 130 into a plating bath. After the plated substrate 130 is unloaded from the plating bath, the substrate 130 needs to be rotated again to the horizontal direction. Therefore, the plating bath and its peripheral devices become bulky.

The electroplating apparatus 100 according to an embodiment of the present disclosure performs a plating process by a horizontal electroplating method to solve the above-described problems of the vertical electroplating method. For example, the plurality of cathodes 140 of the electroplating apparatus 100 according to an embodiment of the present disclosure may be disposed on both sides of the substrate 130. For example, the plurality of first cathodes 140A may be disposed on one side of the substrate 130 and the plurality of second cathodes 140B may be disposed on the other side of the substrate 130. Thus, the plurality of cathodes 140 may be electrically connected to the seed pattern on the substrate 130. Therefore, a resistance of the seed pattern can be maintained constant due to multi-contacts between the cathodes 140 and the seed pattern. Thus, in the electroplating apparatus 100 according to an embodiment of the present disclosure, the current density can be maintained uniform throughout the substrate 130 and a uniform plating layer can be formed.

Further, the electroplating apparatus 100 according to an embodiment of the present disclosure performs a plating process by the horizontal electroplating method to reduce or minimize the accumulation of obstacles to plating. For example, in the electroplating apparatus 100 according to an embodiment of the present disclosure, the substrate 130 is disposed in the horizontal direction. Thus, the surface of the substrate 130 may be disposed substantially parallel to the surface of the plating solution SOL. Therefore, it is possible to reduce or minimize the accumulation of a gas or by-product generated during the plating process.

Furthermore, the electroplating apparatus 100 according to an embodiment of the present disclosure performs a plating process by the horizontal electroplating method to reduce or minimize the volume of the system. In general, if in-line processes are used in a manufacturing process, a manufacturing target, e.g., a substrate, is moved in the horizontal direction during the manufacturing process. Thus, if the electroplating apparatus 100 performs a plating process by the horizontal electroplating method, the substrate being disposed in the horizontal direction can be loaded into the plating bath. After the plated substrate is unloaded from the plating bath, the substrate can be moved as it is to a cleaning device. Thus, in the electroplating apparatus 100 according to an embodiment of the present disclosure, any device for rotating the substrate 130 from the horizontal direction to the vertical direction or vice versa is not required. Therefore, the volume of the system can be reduced. According to the vertical electroplating method, the plating bath needs to have a size more than double the lengthwise dimension of the substrate. However, according to the horizontal electroplating method as in the electroplating apparatus 100 according to an embodiment of the present disclosure, the plating bath 110 may have a size much smaller than the double of the size of the substrate 130. Thus, in the electroplating apparatus 100 according to an embodiment of the present disclosure, the size of the plating bath 110 can be reduced to decrease or minimize the volume of the system.

In the electroplating apparatus 100 according to an embodiment of the present disclosure, the cathode 140 is composed of the plurality of cathodes 140, and, thus, different currents for respective plating regions can be achieved. For example, the cathode 140 may include the plurality of first cathodes 140A disposed on one side of the substrate 130 and the plurality of second cathodes 140B disposed on the other side of the substrate 130. The controller CONTROL may regulate voltages applied to the plurality of first cathodes 140A and the plurality of second cathodes 140B respectively facing each other. Thus, the cathode 140 may implement different currents for respective plating regions. For example, in order to implement a higher current in a plating region corresponding to the leftmost first cathode 140A and second cathode 140B among the plurality of first cathodes 140A and the plurality of second cathodes 140B than in a plating region corresponding to the first cathode 140A and second cathode 140B located next to the leftmost ones, a voltage applied to the leftmost first cathode 140A and second cathode 140B may be set to be higher than a voltage applied to the first cathode 140A and second cathode 140B located next to the leftmost ones. As such, when a voltage applied to one of the first cathodes 140A and one of the second cathodes 140B is set to be different from a voltage applied to another one of the first cathodes 140A and another one of the second cathodes 140B, a current in the plating region corresponding to one of the first cathodes 140A and another one of the second cathodes 140B can be different from a current in the plating region corresponding to another one of the first cathodes 140A and another one of the second cathodes 140B. Thus, as shown in FIG. 4, if five pairs of cathodes are disposed, it is possible to implement different currents for five plating regions, respectively.

If one single cathode is disposed on one side of the substrate and another single cathode is disposed on the opposite side of the substrate, a single voltage is applied through the cathode to all of plating regions. Therefore, different currents for respective plating regions may not be achieved. That is, if a single cathode is disposed on each of the both sides of the substrate, the same current is implemented for the entire region of the substrate.

However, in the electroplating apparatus 100 according to an embodiment of the present disclosure, since the plurality of first cathodes 140A is disposed on one side of the substrate and the plurality of second cathodes 140B is disposed on the other side of the substrate, different currents for respective plating regions may be achieved compared to the case where a single first cathode is disposed on one side of the substrate and a single second cathode is disposed on the other side of the substrate.

As described above, in the electroplating apparatus 100 according to an embodiment of the present disclosure, different currents for respective plating regions may be achieved using the plurality of first cathodes 140A and the plurality of second cathodes 140B. Therefore, in the electroplating apparatus 100 according to an embodiment of the present disclosure, a plating layer with a uniform thickness can be formed on the substrate 130.

For example, the area of plating in a plating region corresponding to the leftmost first cathode 140A and second cathode 140B may be larger than the area of plating in a plating region corresponding to the first cathode 140A and second cathode 140B located next to the leftmost ones. For example, assuming that a plating layer with a plating area of about 1 $cm^2$ may be formed in the plating region corresponding to the leftmost first cathode 140A and second cathode 140B and a plating layer with a plating area of about 1 $mm^2$ may be formed in the plating region corresponding to the first cathode 140A and second cathode 140B located next to the leftmost ones, a seed pattern disposed on the substrate 130 in the plating region corresponding to the leftmost first cathode 140A and second cathode 140B may be greater in size than a seed pattern disposed on the substrate 130 in the plating region corresponding to the first cathode 140A and second cathode 140B located next to the leftmost ones. However, if a current in the plating region corresponding to the leftmost first cathode 140A and second cathode 140B may be the same as a current in the plating region corresponding to the first cathode 140A and second cathode 140B located next to the leftmost ones, a current density of the seed pattern in the plating region corresponding to the first cathode 140A and second cathode 140B located next to the leftmost ones may be greater than a current density of the seed pattern in the plating region corresponding to the leftmost first cathode 140A and second cathode 140B. In this case, a plating layer formed in the plating region corresponding to the leftmost first cathode 140A and second cathode 140B may have a smaller thickness than a plating layer formed on the plating region corresponding to the first cathode 140A and second cathode 140B located next to the leftmost ones due to a difference in current density. Therefore, a plating layer with different thicknesses for the respective plating regions may be formed. Thus, the plating layer may not have a uniform thickness.

However, in the electroplating apparatus 100 according to an embodiment of the present disclosure, different currents for respective plating regions can be achieved in consideration of the area of plating in each plating region. For example, the area of plating in a plating region corresponding to the leftmost first cathode 140A and second cathode 140B may be greater than the area of plating in a plating region corresponding to the first cathode 140A and second cathode 140B located next to the leftmost ones. In this case, a higher current may be applied to the plating region corresponding to the leftmost first cathode 140A and second cathode 140B than to the plating region corresponding to the first cathode 140A and second cathode 140B located next to the leftmost ones. Thus, a current density can be uniform in the plating region corresponding to the leftmost first cathode 140A and second cathode 140B and the plating region corresponding to the first cathode 140A and second cathode 140B located next to the leftmost ones. Therefore, in the electroplating apparatus 100 according to an embodiment of the present disclosure, the overall thickness of a plating layer can be uniform, and a difference in thickness of the plating layer caused by a difference in the area of plating can be reduced or minimized. Therefore, a plating layer uniform in thickness and surface profile can be formed.

Further, in the electroplating apparatus 100 according to an embodiment of the present disclosure, the level of a voltage applied to a pair of clamps may be controlled. Thus, a difference in thickness of a plating layer in a plating region corresponding to the pair of cathodes can be reduced or minimized. For example, in the plating region corresponding to the leftmost first cathode 140A and second cathode 140B, as the anode moves, the area of plating may be changed. For example, the area of plating in the plating region corresponding to the leftmost first cathode 140A and second cathode 140B may be about 1 $cm^2$ at a first time point, and the area of plating in the plating region corresponding to the leftmost first cathode 140A and second cathode 140B may be about 1 $mm^2$ at a second time point after the first time point. However, if the leftmost first cathode 140A and second cathode 140B are applied with the same voltage at the first time point and the second time point, a plating layer with a smaller thickness may be formed at the first time point and a plating layer with a greater thickness may be formed at the second time point. Thus, a voltage applied to the leftmost first cathode 140A and second cathode 140B at the second time point may be smaller than a voltage applied to the leftmost first cathode 140A and second cathode 140B at the first time point in order to implement a uniform current density even when the anode moves. Thus, in the electroplating apparatus 100 according to an embodiment of the present disclosure, the overall thickness of a plating layer can be uniform, and a difference in thickness of the plating layer caused by a difference in the area of plating can be reduced or minimized. Therefore, a plating layer uniform in thickness and surface profile can be formed.

Figure 6:
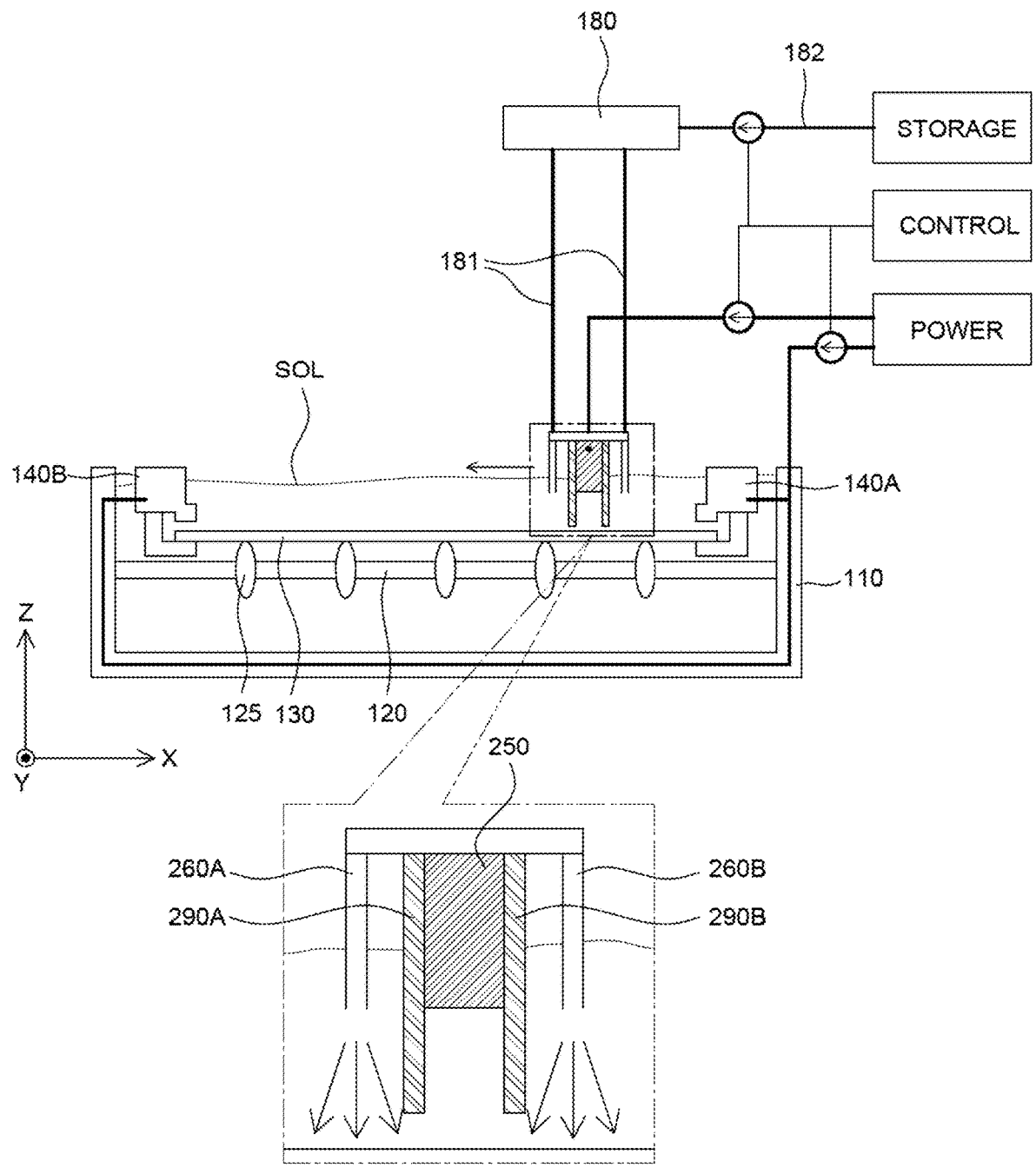
FIG. 6 is a schematic cross-sectional view of an electroplating apparatus according to another embodiment of the present disclosure as taken along an X-axis/Z-axis plane.
Figure 7:
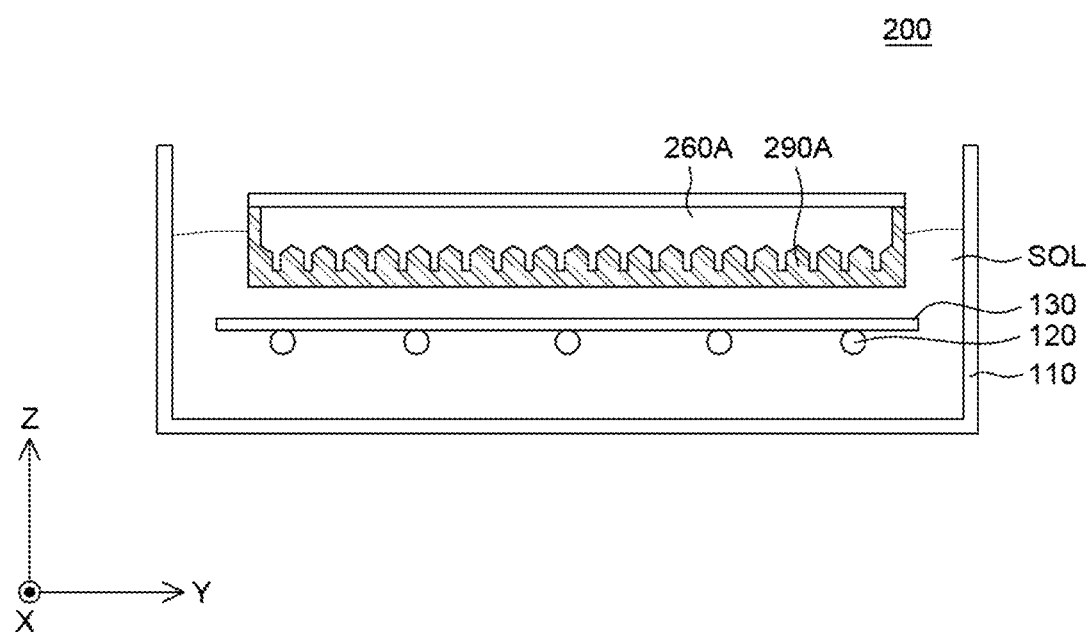
FIG. 7 is a schematic cross-sectional view as taken along a Y-axis/Z-axis plane of FIG. 6.

FIG. 6 is a schematic cross-sectional view of an electroplating apparatus according to another embodiment of the present disclosure as taken along an X-axis/Z-axis plane. FIG. 7 is a schematic cross-sectional view as taken along a Y-axis/Z-axis plane of FIG. 6. An electroplating apparatus 200 shown in FIG. 6 and FIG. 7 is substantially the same as the electroplating apparatus 100 shown in FIG. 1 through FIG. 5 except that an anode 250 and a spray nozzle 260 are different from those of the electroplating apparatus 100 and a shield 290 is added. Therefore, redundant description thereof will be omitted.

Referring to FIG. 6 and FIG. 7, the electroplating apparatus 200 according to another embodiment of the present disclosure includes the spray nozzle 260 and the shield 290 disposed on at least one side of the anode 250. In this case, the anode 250, the spray nozzle 260, and the shield 290 may be connected to each other by an additional fixing unit. Otherwise, the shield 290 may be fixed to the anode 250 without any fixing unit and the spray nozzle 260 may be fixed to the shield 290. The layout and connection of the anode 250, the spray nozzle 260, and the shield 290 may be designed freely.

Referring to FIG. 6, the spray nozzle 260 may be disposed on both sides of the anode 250. The spray nozzle 260 may include a plurality of spray nozzles disposed in the Y-axis direction along a surface of the anode 250. For example, the spray nozzle 260 may include a plurality of first spray nozzles 260A disposed on one side of the anode 250 and a plurality of second spray nozzles 260B disposed on the other side of the anode 250 based on the X-axis direction that is the movement direction of the anode 250. However, the present disclosure is not limited thereto. The spray nozzle 260 may be disposed on only one side of the anode 250.

The plating solution SOL is sprayed through an outlet opening of the spray nozzle 260. In this case, the outlet opening of the spray nozzle 260 may be disposed collinear with an end surface (or a tip or an end) of the anode 250 adjacent to the substrate 130, but is not limited thereto. A position of the outlet opening of the spray nozzle 260 may be adjusted freely depending on the shape and thickness of a plating layer to be formed. Herein, the outlet opening of the spray nozzle 260 may refer to an end of the spray nozzle 260 through which the plating solution SOL is sprayed.

The shield 290 may regulate a current density between the anode 250 and the substrate 130 by changing the flow of the plating solution SOL filled in the plating bath 110 and the flow of the plating solution SOL sprayed through the spray nozzle 260. The shield 290 may be formed such that one end adjacent to the substrate 130 is more adjacent to the substrate 130 than the anode 250. For example, the shield 290 may have a shape protruding more downward towards the plating bath 110 than the anode 250.

The shield 290 is disposed on both lateral surfaces of the anode 250 and disposed between the anode 250 and the spray nozzle 260. The shield 290 may be disposed in the Y-axis direction along the surface of the anode 250. For example, similar to the anode 250, the shield 290 may have a rectangular shape whose X-axis directional width is smaller than the Y-axis directional length and the Z-axis directional height. Referring to FIG. 6, the shield 290 includes a first shield 290A disposed on one side of the anode 250 and a second shield 290B disposed on the other side of the anode 250 based on the X-axis direction. However, the present disclosure is not limited thereto. The shield 290 may be disposed on only one side of the anode 250.

Referring to FIG. 6, the first shield 290A is disposed between the anode 250 and the plurality of first spray nozzles 260A and the second shield 290B is disposed between the anode 250 and the plurality of second spray nozzles 260B. In this case, each of the first shield 290A and the second shield 290B may be disposed to be in contact with a lateral surface of the anode 250 and spaced at a selected distance from the first spray nozzles 260A and the second spray nozzles 260B. Since the spray nozzle 260 is spaced apart from the shield 290, the plating solution SOL discharged from the outlet opening of the spray nozzle 260 can be sprayed in all directions.

The shield 290 is spaced at a selected distance from the substrate 130 in the Z-axis direction. In this case, the first shield 290A and the second shield 290B may have the same or different lengths. For example, the distance between the first shield 290A and the substrate 130 may be identical to or different from the distance between the second shield 290B and the substrate 130.

In the electroplating apparatus 200 according to another embodiment of the present disclosure, the shield 290 is disposed between the anode 250 and the spray nozzle 260. Thus, the distribution of current density applied to plating regions can be regulated. For example, in the electroplating apparatus 200 according to another embodiment of the present disclosure, the shield 290 is disposed between the anode 250 and the spray nozzle 260. Thus, it is possible to narrow the distribution of current density under the anode 250. If the distribution of current density under the anode 250 is wide, plating is performed to a wider region. A difference in thickness of a plating layer may increase as being away from the center of the anode 250 and a composition ratio of the plating layer is changed. Thus, the quality of the plating layer is degraded. However, in the electroplating apparatus 200 according to another embodiment of the present disclosure, the shield 290 is disposed. Thus, it is possible to decrease a thickness distribution of a plating layer and form a plating layer with a uniform composition ratio.

The effects of the electroplating apparatus 200 according to another embodiment of the present disclosure will be described in more detail with reference to FIG. 8.

Figure 8:
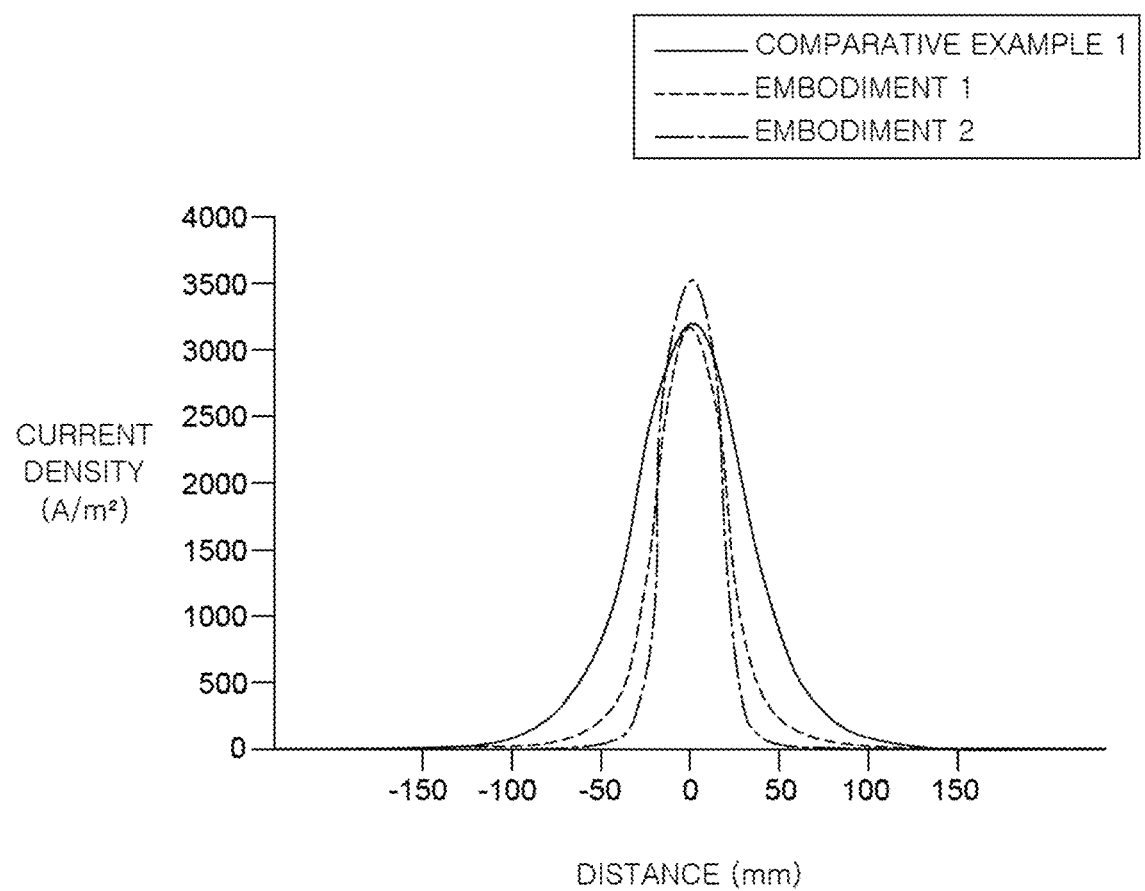
FIG. 8 is a graph showing the simulation results of the current density along a Z-axis direction based on the center of an anode of electroplating apparatuses according to Embodiments 1 and 2 and Comparative Example 1, respectively.

FIG. 8 is a graph showing the simulation results of the current density along a Z-axis direction based on the center of an anode of electroplating apparatuses according to Embodiments 1 and 2 and Comparative Example 1, respectively. In FIG. 8, a position corresponding to the center of the anode is set to 0 and a distance from the center of the anode is plotted on the X-axis and a current density at the corresponding position is plotted on the Y-axis.

Comparative Example 1 is an electroplating apparatus that does not include a shield but includes an anode and a spray nozzle disposed on both sides of the anode.

Embodiment 1 is the electroplating apparatus 200 according to another embodiment of the present disclosure. Further, Embodiment 1 includes the anode 250, the shield 290 disposed on both sides of the anode 250, and the spray nozzle 260 disposed on both sides of the shield 290. In this case, a distance between the shield 290 and the substrate 130 is about 20 mm.

Embodiment 2 is the electroplating apparatus 200 according to another embodiment of the present disclosure. Further, Embodiment 2 includes the anode 250, the shield 290 disposed on both sides of the anode 250, and the spray nozzle 260 disposed on both sides of the shield 290. In this case, a distance between the shield 290 and the substrate 130 is about 10 mm.

In all of Comparative Example 1 and Embodiments 1 and 2, the X-axis directional width of the anode 250 was set to about 40 mm and the distance between the substrate 130 and the anode 250 was set to about 30 mm. Further, the anode 250 was formed of copper and an electrolyte used instead of the plating solution SOL contained sulfuric acid ($H_2SO_4$), and the substrate 130 was formed of ITO. Furthermore, the anode 250 had an electric conductivity of about 5e7 S/m, the electrolyte had an electric conductivity of about 22 S/m, and the substrate 130 had an electric conductivity of about 1e5 S/m. Moreover, the anode was applied with about 5 V and the cathode 140 was applied with about 0 V and a contact resistance between the cathode 140 and the substrate 130 was set to about 0Ω. Based on the above-described conditions, the simulation was performed on Comparative Example 1 and Embodiments 1 and 2 using a simulation tool SIEMENS Star CCM+.

As the simulation results, the width of the distribution corresponding to about 50% of the maximum current density ($I_{0.5}/I_{max}$) and the width of the distribution corresponding to about 10% of the maximum current density ($I_{0.1}/I_{max}$) were as shown in the following Table 1.

TABLE 1

|  | $I_{0.5}/I_{max}$ | $I_{0.1}/I_{max}$ |
|---|---|---|
| Comparative Example 1 | 80 mm | 165 mm |
| Embodiment 1 | 50 mm | 100 mm |
| Embodiment 2 | 40 mm | 65 mm |

Referring to FIG. 8, a current density of Comparative Example 1 without using a shield appears non-peaky compared to that of Embodiments 1 and 2. Comparative Example 1 has a current density value greater than 0 and has the greatest area of plating. Therefore, if a plating layer is formed of Invar, both lateral portions of the plating layer have low current density values. Thus, a composition ratio of nickel in the plating layer is expected to increase. For example, in Comparative Example 1, a difference between the width of the distribution corresponding to about 50% of the maximum current density ($I_{0.5}/I_{max}$) and the width of the distribution corresponding to about 10% of the maximum current density ($I_{0.1}/I_{max}$) is about 85 mm. Comparative Example 1 shows the biggest difference compared to Embodiments 1 and 2. In Comparative Example 1 having the greatest area with an increase in a composition ratio of nickel compared to Embodiments 1 and 2, the both lateral portions of the plating layer with a higher thermal expansion coefficient than a central portion may have the greatest size.

A current density of Embodiment 1 in which the shield 290 is used and a distance between the shield 290 and the substrate 130 is about 20 mm appears peaky compared to that of Comparative Example 1. Thus, Embodiment 1 has a current density value greater than 0 and has a smaller area of plating than Comparative Example 1. Therefore, if a plating layer is formed of Invar, both lateral portions of the plating layer have low current density values. Thus, Embodiment 1 is expected to have a smaller area where a composition ratio of nickel in the plating layer is expected to increase than Comparative Example 1. For example, in Embodiment 1, a difference between the width of the distribution corresponding to about 50% of the maximum current density ($I_{0.5}/I_{max}$) and the width of the distribution corresponding to about 10% of the maximum current density ($I_{0.1}/I_{max}$) is about 50 mm. Embodiment 1 shows a smaller difference than Comparative Example 1. In Embodiment 1 having a smaller area with an increase in a composition ratio of nickel than Comparative Example 1, the both lateral portions of the plating layer with a higher thermal expansion coefficient than a central portion may have a smaller size than those of Comparative Example 1.

A current density of Embodiment 2 in which the shield 290 is used and a distance between the shield 290 and the substrate 130 is about 10 mm appears peaky compared to that of Comparative Example 1 and Embodiment 1. Thus, Embodiment 2 has a current density value greater than 0 and has a smaller area of plating than Comparative Example 1 and Embodiment 1. Therefore, if a plating layer is formed of Invar, both lateral portions of the plating layer have low current density values. Thus, Embodiment 2 is expected to have a smaller area where a composition ratio of nickel in the plating layer is expected to increase than Comparative Example 1 and Embodiment 1. For example, in Embodiment 2, a difference between the width of the distribution corresponding to about 50% of the maximum current density ($I_{0.5}/I_{max}$) and the width of the distribution corresponding to about 10% of the maximum current density ($I_{0.1}/I_{max}$) is about 25 mm. Embodiment 2 shows a smaller difference than Comparative Example 1 and Embodiment 1. In Embodiment 2 having a smaller area with an increase in a composition ratio of nickel than Comparative Example 1 and Embodiment 1, the both lateral portions of the plating layer with a higher thermal expansion coefficient than a central portion may have a smaller size than those of Comparative Example 1 and Embodiment 1.

According to the above-described simulation results, Embodiments 1 and 2 using the shield 290 show the peakier distribution of current density than Comparative Example 1 without using a shield. Thus, current densities in both ends of the anode 250 are lower in Embodiments 1 and 2 than in Comparative Example 1. Thus, Embodiments 1 and 2 are expected to have a smaller area where a composition ratio of nickel in a plating layer is expected to increase than Comparative Example 1. Further, both lateral portions of the plating layer with a higher thermal expansion coefficient than a central portion may have a smaller size than those of Comparative Example 1. Thus, in Embodiments 1 and 2, a thickness distribution of a plating layer can be decreased and a plating layer with a uniform composition ratio can be formed, compared to Comparative Example 1. Therefore, a plating layer with a uniformly lower thermal expansion coefficient can be formed in Embodiments 1 and 2 than in Comparative Example 1.

A mask for deposition of an organic layer may be manufactured using an electroplating apparatus and the mask may be formed of Invar. In this case, it is very important to realize a uniform composition ratio of nickel forming Invar in the range of from about 36% to about 40%. The mask for deposition of an organic layer is used in a heated environment instead of at room temperature. Further, the organic layer needs to be deposited accurately at a desired position using the mask, and, thus, a pattern shape of the mask needs to be very precisely formed. If the size or shape of the pattern changes as the temperature changes, it is impossible to deposit the organic layer at a desired position. Thus, if a mask is formed of Invar by electroplating, the composition ratio of nickel in the mask needs to be maintained uniform in the range of from about 36% to about 40% to reduce or minimize a change in size of the mask as the temperature changes. If the composition ratio of nickel in the mask is out of the range of from about 36% to about 40%, the thermal expansion coefficient of the mask sharply increases. Further, during a process of depositing an organic layer using the mask, it is impossible to deposit the organic layer accurately at a desired position.

In view of the foregoing, if the mask is manufactured using the electroplating apparatus of Comparative Example 1, both lateral portions of a plating layer may have a large area where the composition ratio of nickel increases compared to Embodiments 1 and 2. The mask manufactured using the electroplating apparatus of Comparative Example 1 has a relatively high thermal expansion coefficient. Thus, during a process of depositing an organic layer using the mask, it is impossible to deposit the organic layer accurately at a desired position.

However, if the mask is manufactured using the electroplating apparatus 200 of Embodiments 1 and 2, both lateral portions of a plating layer may have a small area where the composition ratio of nickel increases compared to Comparative Example 1. The mask manufactured using the electroplating apparatus 200 of Embodiments 1 and 2 has a relatively low thermal expansion coefficient. Thus, during a process of depositing an organic layer using the mask, it is possible to deposit the organic layer accurately at a desired position.

Further, referring to Embodiments 1 and 2, it can be seen that as the distance between the shield 290 and the substrate 130 decreases, the current density appears peakier. Thus, in the electroplating apparatus 200 according to another embodiment of the present disclosure, the distance between the shield 290 and the substrate 130 can be regulated selectively to form a plating layer with a desired nickel composition ratio and a desired uniformity in a nickel composition ratio.

Figure 9:
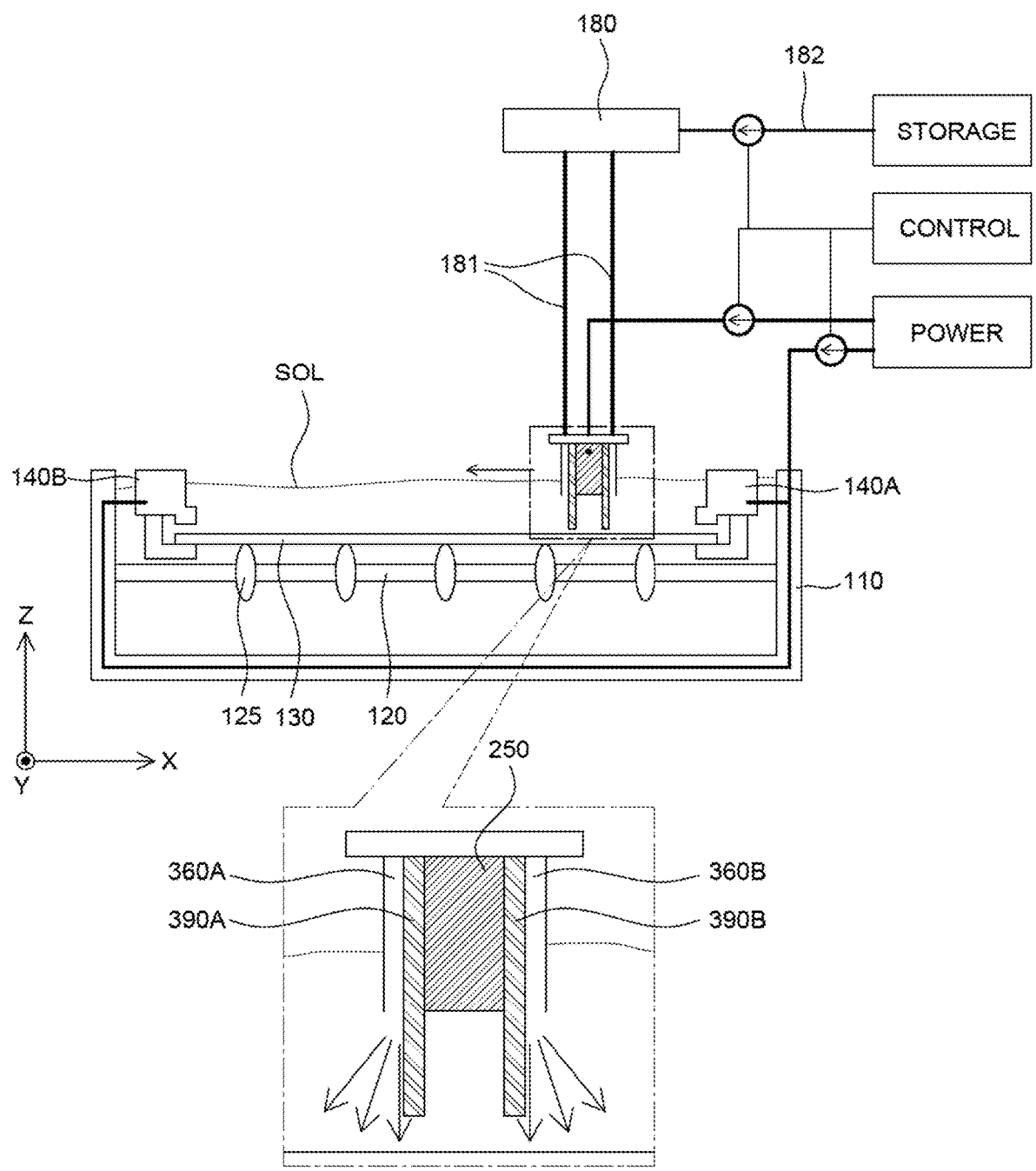
FIG. 9 is a schematic cross-sectional view of an electroplating apparatus according to yet another embodiment of the present disclosure as taken along an X-axis/Z-axis plane.

FIG. 9 is a schematic cross-sectional view of an electroplating apparatus according to yet another embodiment of the present disclosure as taken along an X-axis/Z-axis plane. An electroplating apparatus 300 shown in FIG. 9 is substantially the same as the electroplating apparatus 200 shown in FIG. 6 and FIG. 7 except the layout of a spray nozzle 360 and a shield 390. Therefore, redundant description thereof will be omitted.

Referring to FIG. 9, the electroplating apparatus 300 according to yet another embodiment of the present disclosure includes the spray nozzle 360 and the shield 390 disposed on both sides of the anode 250. In this case, the shield 390 is disposed between the anode 250 and the spray nozzle 360 and disposed to be in contact with the spray nozzle 360. For example, a first shield 390A and a plurality of first spray nozzles 360A are disposed sequentially on one side of the anode 250 based on the X-axis direction. Further, a second shield 390B and a plurality of second spray nozzles 360B are disposed sequentially on the other side of the anode 250 based on the X-axis direction. In this case, the first shield 390A is in contact with the plurality of first spray nozzles 360A and the second shield 390B is in contact with the plurality of second spray nozzles 360B. In this case, the contact structure between the shield 390 and the spray nozzle 360 may refer to a contact structure between a portion of a lateral surface of the shield 390 and a lateral surface of an outlet opening of the spray nozzle 360. If the outlet opening of the spray nozzle 360 for spraying the plating solution SOL is in contact with the lateral surface of the shield 390, the fluid behavior of the plating solution SOL sprayed to a plating region may be changed.

In the electroplating apparatus 300 according to yet another embodiment of the present disclosure, the shield 390 is disposed between the anode 250 and the spray nozzle 360 and the lateral surface of the outlet opening of the spray nozzle 360 is disposed to be in contact with the shield 390. If the outlet opening of the spray nozzle 360 is disposed to be in contact with the shield 390, the plating solution SOL discharged from the spray nozzle 360 is sprayed downward in the Z-axis direction along the lateral surface of the shield 390. For example, the shield 390 functions to directly force a spraying direction of the plating solution SOL discharged from the spray nozzle 360. Thus, the electroplating apparatus 300 according to yet another embodiment of the present disclosure can use the shield 390 to target the plating solution SOL at a desired plating region. The plating solution SOL discharged from the spray nozzle 360 is new relative to the plating solution SOL already present in the plating bath 110. Therefore, the plating solution SOL discharged from the spray nozzle 360 may have a concentration more suitable for plating than the plating solution SOL already present in the plating bath 110. Therefore, the electroplating apparatus 300 according to yet another embodiment of the present disclosure can maintain the plating solution SOL at a desired concentration and directly supply the plating solution SOL to and around a plating region. Thus, a plating layer with a uniform composition can be formed.

Figure 10:
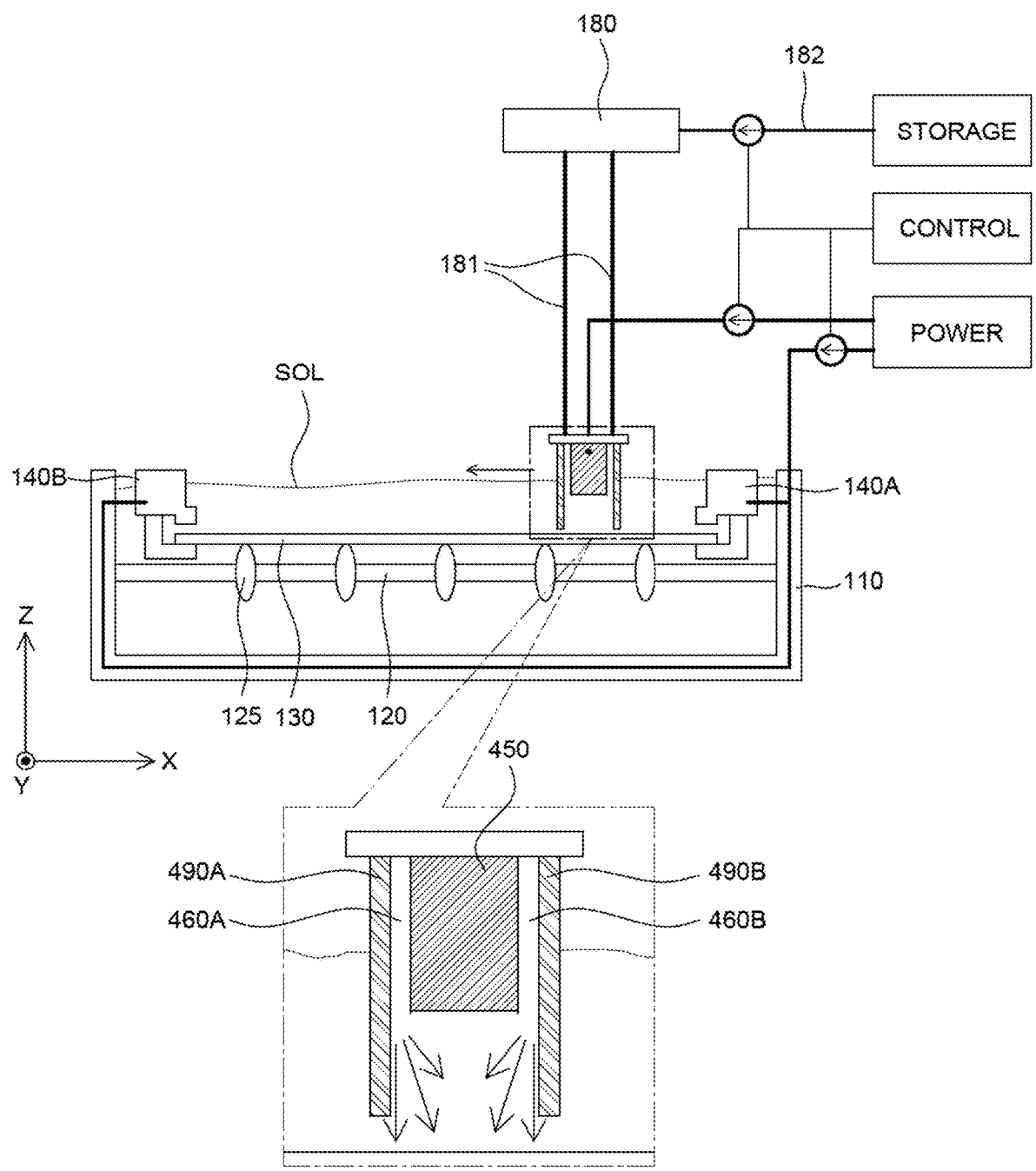
FIG. 10 is a schematic cross-sectional view of an electroplating apparatus according to still another embodiment of the present disclosure as taken along an X-axis/Z-axis plane.

FIG. 10 is a schematic cross-sectional view of an electroplating apparatus according to still another embodiment of the present disclosure as taken along an X-axis/Z-axis plane. An electroplating apparatus 400 shown in FIG. 10 is substantially the same as the electroplating apparatus 200 shown in FIG. 6 and FIG. 7 except the layout of an anode 450, a spray nozzle 460 and a shield 490. Therefore, redundant description thereof will be omitted.

Referring to FIG. 10, the electroplating apparatus 400 according to still another embodiment of the present disclosure includes the spray nozzle 460 and the shield 490 disposed on both sides of the anode 450. For example, the spray nozzle 460 is arranged between a space between the shield 490 and the anode 450. That is, the first spray nozzles 460A are disposed between the anode 450 and the first shield 490A and the second spray nozzles 460B are disposed between the anode 450 and second shield 490B. In this case, the spray nozzle 460 is disposed between and contacting the anode 450 and the shield 490. For example, a plurality of first spray nozzles 460A and a first shield 490A are disposed sequentially on one side of the anode 450 based on the X-axis direction, and a plurality of second spray nozzles 460B and a second shield 490B are disposed sequentially on the other side of the anode 450 based on the X-axis direction. In this case, lateral surfaces of outlet openings of the respective first spray nozzles 460A may be in contact (or in direct contact) with a lateral surface of the first shield 490A. Further, lateral surfaces of outlet openings of the respective second spray nozzles 460B may be in contact (or in direct contact) with a lateral surface of the second shield 490B. However, in other embodiments, the spray nozzle 460 does not have to contact the lateral surfaces of the shield 490 or the anode 450 and may be spaced apart.

In the electroplating apparatus 400 according to still another embodiment of the present disclosure, the X-axis directional width of the anode 450 may be regulated to implement a uniform current density under the anode 450. If the spray nozzle 460 is disposed inside the shield 490, a distance between the first spray nozzles 460A and the second spray nozzles 460B may be decreased. However, if the first spray nozzles 460A and the second spray nozzles 460B that spray the plating solution SOL are disposed too close to each other, the sprayed plating solution SOL may flow excessively. Thus, in the electroplating apparatus 400 according to still another embodiment of the present disclosure, the distance between the first spray nozzles 460A and the second spray nozzles 460B may be regulated to implement a uniform current density under the anode 450.

In the electroplating apparatus 400 according to still another embodiment of the present disclosure, the spray nozzle 460 is disposed within a region formed by the shield 490. Thus, the spray nozzle 460 may not be affected by a swirl generated outside the shield 490. For example, if the anode and the shield move for plating, a swirl may be generated outside the shield located in the movement direction. The swirl may cause the non-uniformity in the flow of a fluid and particles in a plating region. Further, the swirl and the non-uniformity in the flow of a fluid may result in a decrease in concentration of particles dispersed in the plating solution SOL in the plating region. Therefore, a plating layer with a sufficient thickness may not be formed. However, in the electroplating apparatus 400 according to still another embodiment of the present disclosure, the spray nozzle 460 is disposed inside the shield 490. Thus, the spray nozzle 460 may not be affected by a swirl generated outside the shield 490 and the plating solution SOL may be supplied stably to a plating region inside the shield 490 and the flow velocity of the plating solution SOL can be uniform.

Further, in the electroplating apparatus 400 according to still another embodiment of the present disclosure, the outlet opening of the spray nozzle 460 is disposed to be in contact with the shield 490. Thus, the plating solution SOL can be sprayed easily to the plating region along a surface of the shield 490.

The effects of the electroplating apparatus 400 according to still another embodiment of the present disclosure will be described in more detail with reference to FIG. 11 through FIG. 15.

Figure 11:
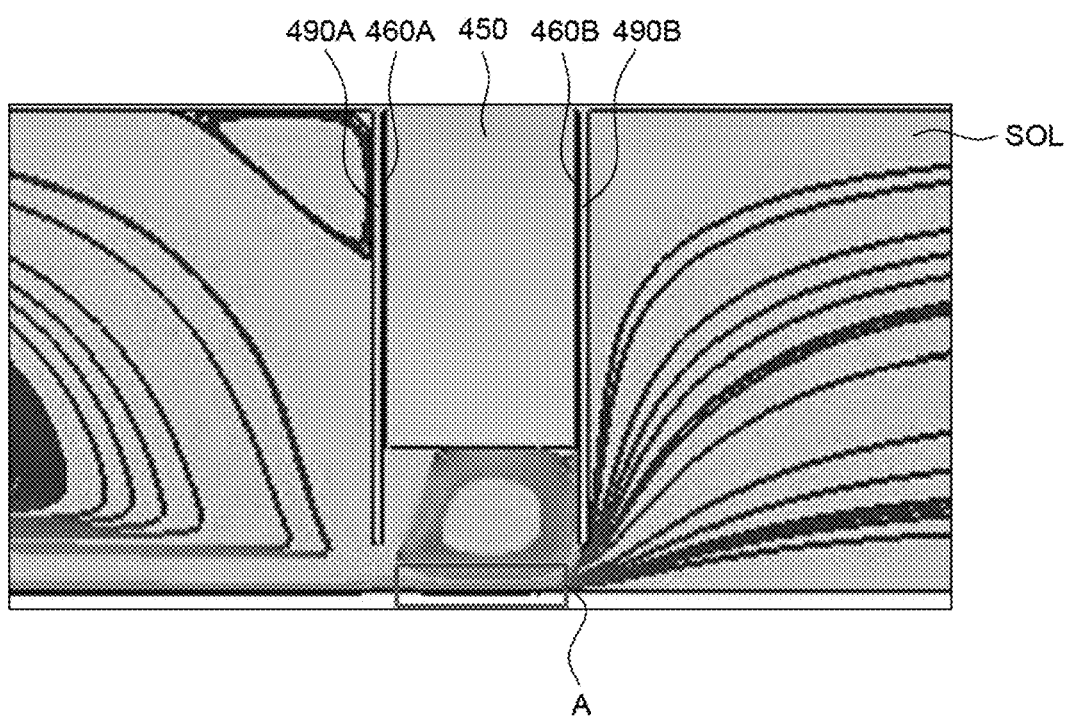
FIG. 11 shows the simulation result of the flow velocity of an electroplating apparatus according to Embodiment 3.
Figure 12:
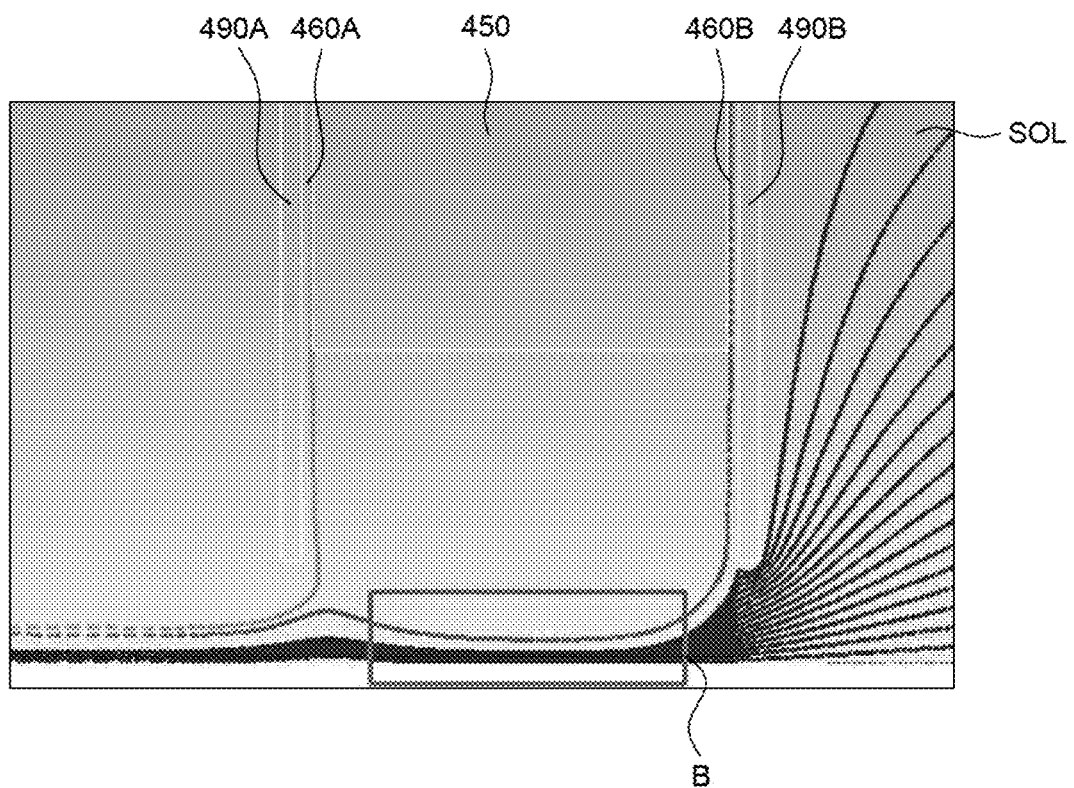
FIG. 12 shows the simulation result of the flow of particles of the electroplating apparatus according to Embodiment 3.

FIG. 11 shows the simulation result of the flow velocity of an electroplating apparatus according to Embodiment 3. FIG. 12 shows the simulation result of the flow of particles of the electroplating apparatus according to Embodiment 3. In FIG. 11, the flow of a fluid generated as the anode 450 moves to the right is shown in color. Further, in FIG. 12, the flow of particles, e.g., ions, dispersed in the plating solution generated as the anode 450 moves to the right is shown.

Embodiment 3 is the electroplating apparatus 400 according to still another embodiment of the present disclosure. Further, Embodiment 3 includes the anode 450, the spray nozzle 460 disposed on both sides of the anode 450, and the shield 490 disposed on both sides of the spray nozzle 460. In this case, a distance between the shield 490 and the substrate 130 is 10 mm.

It can be seen that if the spray nozzle 460 is disposed between the anode 450 and the shield 490 as in Embodiment 3, the flow of a fluid and particles above the substrate 130 becomes uniform.

For example, in Embodiment 3 as shown in FIG. 11, a uniform flow of a fluid with relatively high flow velocity can be observed in a region A which is a plating region on the substrate located under the anode 450 and in which plating is actually performed. Since a uniform flow of the fluid can be observed in the region A, a plating layer with a uniform thickness and a uniform composition ratio can be formed in Embodiment 3.

Further, in Embodiment 3 as shown in FIG. 12, particles supplied from the plating solution SOL filled in the plating bath and particles sprayed from the right spray nozzle 460B can be observed uniformly in a region B which is on the substrate located under the anode 450 and in which plating is actually performed. Particularly, it can be seen that the new plating solution supplied from the spray nozzle 460B flows along the shield 490B without being affected by an external swirl and stably passes through between the anode 450 and the substrate 130. Since a uniform flow of the particles can be observed in the region B, a plating layer with a uniform thickness and a uniform composition ratio can be formed in Embodiment 3.

Figure 13:
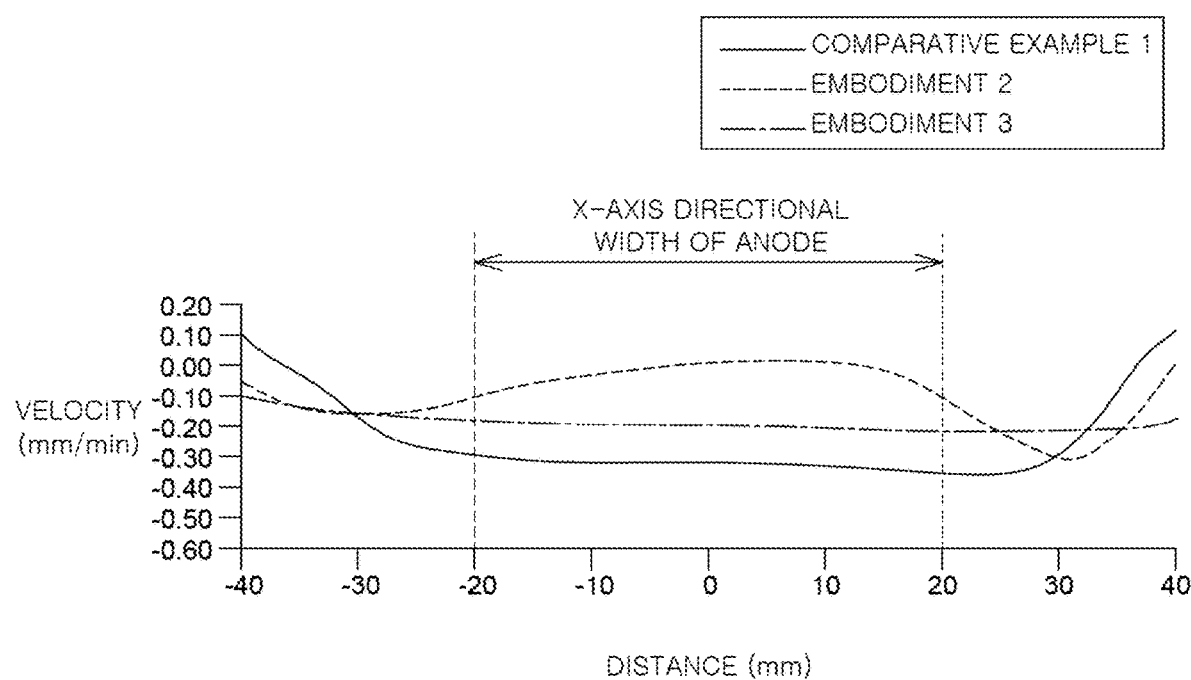
FIG. 13 is a graph showing the simulation results of the velocity profile of the electroplating apparatuses according to Embodiments 2 and 3 and Comparative Example 1, respectively.

FIG. 13 is a graph showing the simulation results of the velocity profile of the electroplating apparatuses according to Embodiments 2 and 3 and Comparative Example 1, respectively. The velocity profile shows the movement direction and movement velocity of a fluid at a corresponding position. In the graph shown in FIG. 13, a position corresponding to the center of the anode is set to 0 and a distance from the center of the anode is plotted on the X-axis. Further, a positive (+) value on the Y-axis indicates the flow of the fluid to the right and a negative (−) value indicates the flow of the fluid to the left. Herein, the velocity of the fluid on the Y-axis is measured based on a point about 0.8 mm above the substrate.

As described above, Comparative Example 1 is an electroplating apparatus that does not include a shield but includes an anode and a spray nozzle disposed on both sides of the anode.

Embodiment 2 is the electroplating apparatus 200 according to another embodiment of the present disclosure. Further, Embodiment 2 includes the anode 250, the shield 290 disposed on both sides of the anode 250, and the spray nozzle 260 disposed on both sides of the shield 290. In this case, a distance between the shield 290 and the substrate 130 is about 10 mm.

Embodiment 3 is the electroplating apparatus 400 according to still another embodiment of the present disclosure. Further, Embodiment 3 includes the anode 450, the spray nozzle 460 disposed on both sides of the anode 450, and the shield 490 disposed on both sides of the spray nozzle 460. In this case, a distance between the shield 490 and the substrate 130 is about 10 mm.

In all of Comparative Example 1 and Embodiments 2 and 3, the X-axis directional width of the anode 250 or 450 was set to about 40 mm and the distance between the substrate 130 and the anode 250 or 450 was set to about 30 mm. Further, the anode 250 or 450 was formed of copper and the plating solution SOL contained water which is a fluid. The substrate 130 was formed of ITO. Furthermore, the anode 250 or 450 had an electric conductivity of about 5e7 S/m, and the substrate 130 had an electric conductivity of about 1e5 S/m. Moreover, the anode 250 or 450 was applied with about 5 V and the cathode 140 was applied with about 0 V and a contact resistance between the cathode 140 and the substrate 130 was set to about 0Ω. Further, the plating solution SOL was sprayed from the spray nozzle 260 or 460 at about 50 lpm and the anode 250 or 450 was moved to the right at a speed of about 370 mm/min based on the graph of FIG. 13. The simulation was performed on Comparative Example 1 and Embodiments 2 and 3 using a simulation tool ANSYS FLUENT based on the above-described conditions.

Referring to FIG. 13, it can be seen that in Comparative Example 1 without using a shield, the velocity of a fluid flowing from the plating region under the anode to the left is too high compared to Embodiments 2 and 3 using the shields 290 and 490, respectively. Further, as described above with reference to FIG. 8, Comparative Example 1 without using a shield has a wide distribution of current density, and, thus, both sides of a plating layer may have a non-uniform composition ratio of plating and an increase in thickness distribution.

Further, referring to FIG. 13, it can be seen that in Embodiment 2 in which the spray nozzle 260 is disposed outside the shield 290, the flow velocity in the plating region is a bit slow. However, it can be seen that the flow velocity in the plating region is higher in Embodiment 3 in which the spray nozzle 460 is disposed inside the shield 490 than in Embodiment 2 but lower than in Comparative Example 1.

Furthermore, it can be seen that the flow velocity in the plating region is more uniform in Embodiment 3 than in Comparative Example 1. For example, it can be seen that the flow velocity in a region corresponding to the X-axis directional width of the anode 250 of Embodiment 3 shows a smaller deviation than the flow velocity in a region corresponding to the X-axis directional width of the anode of Comparative Example 1.

Embodiment 3 can solve the decrease in flow velocity in the plating region caused by a swirl generated outside the shield 490 and suppress the decrease in concentration in the plating region caused by a high flow velocity in a plating region. Further, Embodiment 3 can form a plating layer with a uniform thickness due to a uniform flow velocity in the plating region.

Hereafter, the effects of the electroplating apparatus 400 will be described with reference to FIG. 14A, FIG. 14B, and FIG. 15 by comparison with a vertical electroplating apparatus including a shield.

Figure 14A:
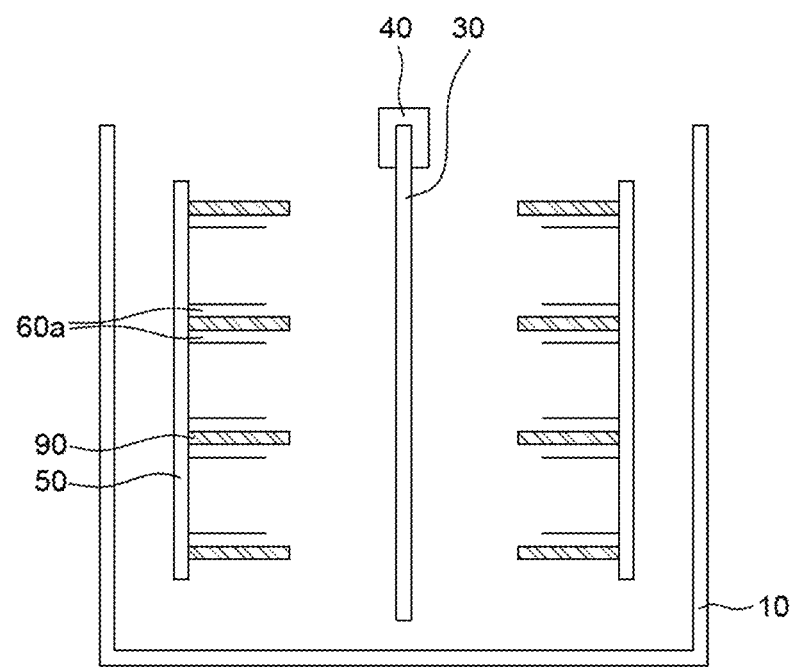
FIG. 14A is a schematic cross-sectional view of an electroplating apparatus according to Comparative Example 2.
Figure 14B:
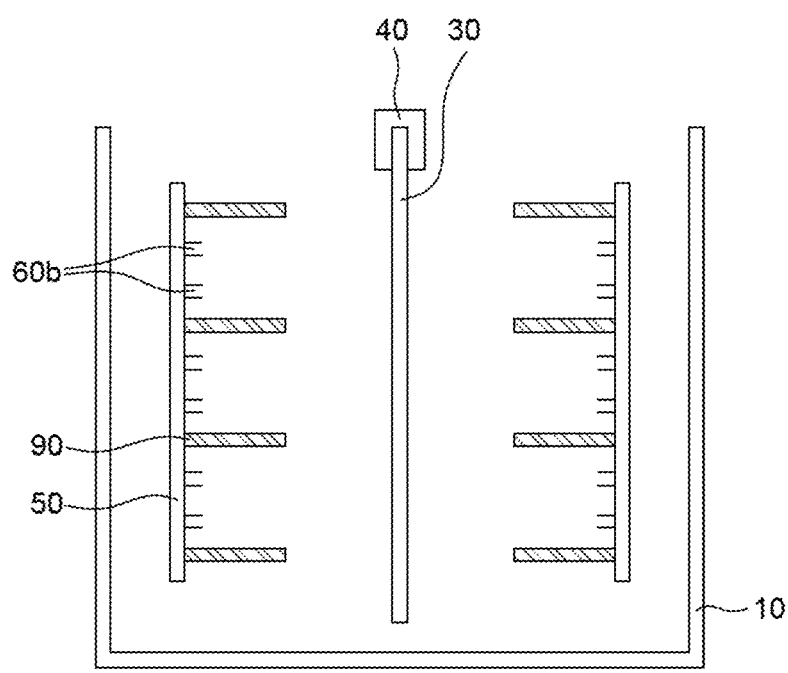
FIG. 14B is a schematic cross-sectional view of an electroplating apparatus according to Comparative Example 3.

FIG. 14A is a schematic cross-sectional view of an electroplating apparatus according to Comparative Example 2. FIG. 14B is a schematic cross-sectional view of an electroplating apparatus according to Comparative Example 3.

Comparative Example 2 is a vertical electroplating apparatus including a shield 90. Referring to FIG. 14A, the vertical electroplating apparatus according to Comparative Example 2 includes a plating bath 10, a substrate 30, a cathode 40, an anode 50, the shield 90, and a spray nozzle 60a. For example, in the vertical electroplating apparatus according to Comparative Example 2, the substrate 30 is disposed in a vertical direction within the plating bath 10 and the cathode 40 is connected to one side of the substrate 30. The anode 50 is disposed on both sides of the substrate 30 at a distance from the substrate 30 and disposed parallel to the substrate 30. The shield 90 is disposed on a surface of the anode 50 and has a structure protruding from the anode 50 toward the substrate 30. A plurality of shields 90 is disposed at the same distance as the shields 490 of Embodiment 3. In this case, a distance between the shield 90 and the substrate 30 is 10 mm. The spray nozzle 60a is in contact with the shield 90. An outlet opening of the spray nozzle 60a is disposed to be in contact with a lateral surface of the shield 90.

Comparative Example 3 is a vertical electroplating apparatus including a shield. Referring to FIG. 14B, the vertical electroplating apparatus according to Comparative Example 3 is substantially the same as the vertical electroplating apparatus according to Comparative Example 2 except the layout of a spray nozzle 60b. For example, in the vertical electroplating apparatus according to Comparative Example 3, the spray nozzle 60b is disposed on the surface of the anode 50 and sprays a plating solution toward the substrate 30. Unlike Comparative Example 2 in which the outlet opening of the spray nozzle 60a is in contact with the lateral surface of the shield, an outlet opening of the spray nozzle 60b of Comparative Example 3 is spaced apart from the shield 90.

Embodiment 3 is the electroplating apparatus 400 according to still another embodiment of the present disclosure. Further, Embodiment 3 includes the anode 450, the spray nozzle 460 disposed on both sides of the anode 450, and the shield 490 disposed on both sides of the spray nozzle 460. In this case, a distance between the shield 490 and the substrate 130 is about 10 mm.

Figure 15:
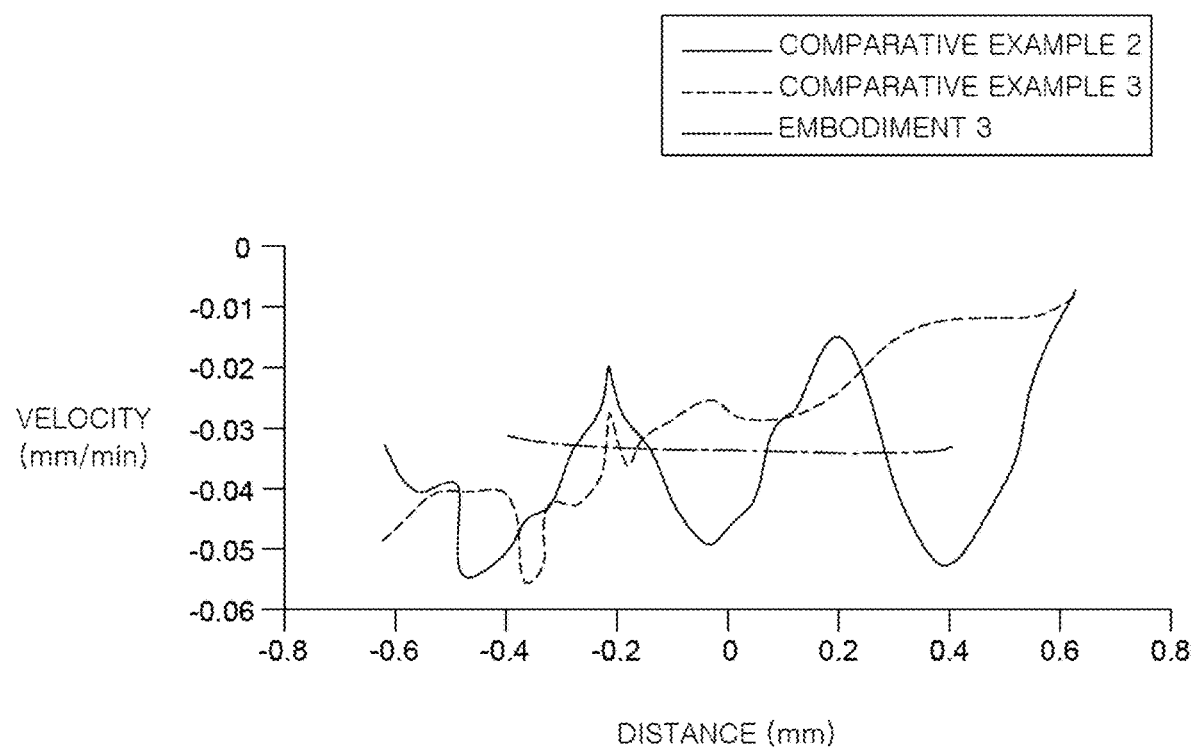
FIG. 15 is a graph showing the simulation results of the velocity profile of the electroplating apparatuses according to Embodiment 3 and Comparative Examples 2 and 3, respectively.

FIG. 15 is a graph showing the simulation results of the velocity profile of the electroplating apparatuses according to Embodiment 3 and Comparative Examples 2 and 3, respectively. In the graph shown in FIG. 15, a position corresponding to the center of the anode is set to 0 and a distance from the center of the anode is plotted on the X-axis. In Embodiment 3, a negative (−) value on the Y-axis indicates the flow of the fluid to the left. Herein, the velocity of the fluid on the Y-axis is measured based on a point 0.8 mm above the substrate. Further, in Comparative Examples 2 and 3, a negative (−) value on the Y-axis indicates the downward flow of the fluid. Herein, the velocity of the fluid on the Y-axis is measured based on a point about 0.8 mm left from the substrate.

Referring to FIG. 15, it can be seen that in the respective vertical electroplating apparatuses according to Comparative Examples 2 and 3, there is a great difference in flow velocity in a plating region above the anode. For example, within the experimental range, the degree of uniformity in the flow velocity for Comparative Example 2 was about 28% and the degree of uniformity in the flow velocity for Comparative Example 3 was about 22%. Herein, the degree of uniformity in the flow velocity refers to the ratio of the minimum flow velocity to the maximum flow velocity.

However, it can be seen that in Embodiment 3, the flow velocity in a plating region is relatively uniform. For example, within the experimental range, the degree of uniformity in the flow velocity for Embodiment 3 was about 90%. Therefore, the horizontal electroplating apparatuses according to various embodiments of the present disclosure are excellent in the degree of uniformity in the flow velocity compared to the vertical electroplating apparatuses including a shield that controls the flow of a fluid. Therefore, an ion concentration is uniform in a plating region, and, thus, a plating layer with a uniform thickness can be formed.

Electroplating Method

An electroplating method according to an embodiment of the present disclosure includes placing a substrate including a seed pattern in a horizontal direction within a plating bath. Further, the electroplating method includes placing a plurality of cathodes on both sides of the substrate and placing an anode combined with a shield and a spray nozzle above the substrate to be spaced apart from the substrate. The electroplating method also includes applying a current to the plurality of cathodes and the anode and forming a plating layer on the substrate while moving the anode in a first direction. The electroplating method according to an embodiment of the present disclosure will be described based on the electroplating apparatus 200 described above with reference to FIG. 6 and FIG. 7, but is not limited thereto. The electroplating method according to an embodiment of the present disclosure may employ the other electroplating apparatuses 300 and 400 according to various embodiments of the present disclosure.

First, the substrate 130 including the seed pattern is disposed in the horizontal direction within the plating bath 110.

For example, the substrate 130, which is a plating target object, is disposed on the stage 120 located within the plating bath 110. The substrate 130 is disposed in the horizontal direction within the plating bath 110. In this case, the substrate 130 may be disposed such that the surface of the substrate 130 is parallel to the surface of the plating solution SOL within the plating bath 110.

Then, a plurality of cathodes 140 is disposed on both sides of the substrate 130.

The plurality of cathodes 140 is disposed to be in contact with at least a part of the both sides of the substrate 130. In this case, the plurality of cathodes 140 is connected to the seed pattern on the substrate 130 and applies a current thereto. For example, the plurality of cathodes 140 may include a plurality of first cathodes 140A and a plurality of second cathodes 140B, but is not limited thereto. In this case, the plurality of first cathodes 140A may be disposed on one side of the substrate 130 based on the X-axis direction that is a movement direction of the anode 250. Further, the plurality of second cathodes 140B may be disposed on the other side of the substrate 130. In this case, the first cathodes 140A are disposed facing the second cathodes 140B, respectively. For example, the plurality of first cathodes 140A may be disposed collinearly facing the plurality of second cathodes 140B, respectively.

Then, the plating solution SOL is supplied into the plating bath 110. Thus, the plating bath 110 may be filled with the plating solution SOL. When the plating solution SOL fills in the plating bath 110, the plurality of first cathodes 140A and the plurality of second cathodes 140B may be disposed parallel to the surface of the plating solution SOL. The plurality of cathodes 140 may function as clamps to fix the substrate 130. In this case, a virtual plane on which the plurality of first cathodes 140A and the plurality of second cathodes 140B are disposed may be parallel to the surface of the plating solution SOL. Thus, the surface of the substrate 130 can be maintained parallel to the surface of the plating solution SOL.

Then, the anode 250 combined with the shield 290 and the spray nozzle 260 is disposed above the substrate 130 to be spaced apart from the substrate 130.

The anode 250 is disposed at a selected distance from the fixed surface of the substrate 130. In the range where the anode 250 can maintain a constant current with the cathode and have a uniform current density, the distance between the substrate 130 and the anode 250 can be regulated freely. For example, the distance between the substrate 130 and the anode 250 may be about 30 mm, but is not limited thereto.

Herein, the process of placing the anode may further include placing the shield and the spray nozzle on lateral surfaces of the anode, regulating a length of the shield, and regulating a distance between the anode and the substrate.

In the process of placing the shield and the spray nozzle on lateral surfaces of the anode, the shield and the spray nozzle are disposed on both sides of the anode. In this case, the shield may be disposed on both sides of the anode and the spray nozzle may be disposed on both sides of the shield. For example, the shield may be disposed between the anode 250 and the spray nozzle. Referring to the electroplating apparatus 200 shown in FIG. 6, a first shield 290A and a plurality of first spray nozzles 260A are disposed sequentially on one side of the anode 250 based on the X-axis direction. Further, a second shield 290B and a plurality of second spray nozzles 260B are disposed sequentially on the other side of the anode 250 based on the X-axis direction. In this case, a portion of a lateral surface of the shield 290 may be spaced apart from a lateral surface of an outlet opening of the spray nozzle 260.

Otherwise, the spray nozzle may be disposed on both sides of the anode and the shield may be disposed on both sides of the spray nozzle. For example, the spray nozzle may be disposed between the shield and the anode. Referring to the electroplating apparatus 400 shown in FIG. 10, a first shield 490A and a plurality of first spray nozzles 460A are disposed sequentially on one side of the anode 450 based on the X-axis direction. Further, a second shield 490B and a plurality of second spray nozzles 460B are disposed sequentially on the other side of the anode 450 based on the X-axis direction.

The process of regulating a length of the shield 290 is to regulate a distance between the shield 290 and the substrate 130. The shield 290 has a shape protruding more downward than the anode 250. In this case, by regulating the length of the shield 290, the amount of protrusion of the shield 290 from the anode 250 toward the substrate 130 can be regulated. By regulating the length of the shield 290, the distribution of current density and the flow velocity in a plating region can be regulated.

The electroplating method may further include regulating a distance between the anode 250 and the substrate 130. The distance between the anode 250 and the substrate 130 is regulated in consideration of the thickness of a plating layer and the plating speed. In this case, by regulating the distance between the anode 250 and the substrate 130, a distance between the shield 290 connected to the anode 250 and the substrate 130 can also be regulated. Therefore, the distance between the anode 250 and the substrate 130 and the distance between the shield 290 and the substrate 130 can be regulated freely as needed in the plating process.

Then, a current is applied to the plurality of cathodes 140 and the anode 250.

For example, a negative voltage is applied to the cathodes 140 and a positive voltage is applied to the anode 250. Thus, a current may be formed between the plurality of cathodes 140 and the anode 250.

The process of applying a current may include applying a constant current to the seed pattern through the plurality of cathodes 140 and the anode 250. If a constant current flows between the cathodes 140 and the anode 250, a plating layer uniform in thickness and surface profile can be formed.

In this case, the process of applying a constant current may include applying a constant voltage to the anode 250 and applying an AC voltage to the plurality of cathodes 140.

In this case, the process of applying an AC voltage to the plurality of cathodes 140 may include applying, to the plurality of cathodes 140, an AC voltage which varies in level as the anode 250 moves. To maintain a constant current on the substrate 130 even if a position of the anode 250 is changed, the level of the AC current applied to the plurality of cathodes 140 may be changed according to the change in position of the anode 250.

The process of applying an AC voltage to the plurality of cathodes 140 may further include applying the same voltage to the first cathode 140A and the second cathode 140B disposed facing each other. Since the same AC voltage is applied to the first cathode 140A and the second cathode 140B disposed facing each other, the sum of currents applied to the first cathode 140A and the second cathode 140B is maintained constant when the anode 250 moves. Further, a constant current can be maintained between the anode 250 and the cathodes 140.

The process of applying an AC voltage to the plurality of cathodes 140 may further include applying a variable AC voltage to each of the plurality of cathodes 140 based on the area of plating under the anode 250 at a position corresponding to the position of the anode 250. When the anode 250 moves, a voltage to be applied to the plurality of cathodes 140 is regulated or the cathodes 140 are turned on/off based on the area of plating in a plating region under the anode 250 corresponding to the position of the anode 250. A current density can be changed for each plating region, and, thus, the thickness and surface characteristics of a plating layer to be formed on the plating region can be regulated.

Then, a plating layer is formed on the substrate 130 while the anode 250 is moved in the X-axis direction.

For example, the connection unit 171 and the driving unit 172 connected to the anode 250 may be used to move the anode 250 in the X-axis direction. The anode 250 is moved in the X-axis direction in a state where a current is applied to the plurality of cathodes 140 and the anode 250. Thus, a plating layer is formed on the upper surface of the substrate 130 located under the anode 250.

A plating layer may be formed repeatedly by translationally moving the anode 250 in the X-axis direction.

If the spray nozzle 160 is combined with the anode 250, the spray nozzle 160 is moved in the X-axis direction together with the anode 250. The plating solution SOL is supplied from above the substrate 130 through the spray nozzle 160. Thus, it is possible to reduce or minimize a change in concentration of the plating solution SOL within the plating bath 110 and suppress a change in metal content in a plating layer.

The electroplating method according to an embodiment of the present disclosure relates to a horizontal electroplating method by which the plurality of cathodes is disposed on both sides of the substrate. Thus, a resistance of the seed pattern can be maintained constant due to multi-contacts between the cathodes and the seed pattern. Therefore, the current density can be maintained uniform throughout the substrate and a uniform plating layer can be formed. Further, the electroplating method according to an embodiment of the present disclosure can suppress the vertical accumulation of by-products generated during the plating process by placing the surface of the plating solution substantially parallel to the surface of the substrate.

Furthermore, this electroplating method can regulate currents applied to respective plating regions with the plurality of cathodes disposed on the both sides of the substrate and thus change the current density. For example, this electroplating method can achieve different current densities for respective plating regions and thus regulate the thickness and surface characteristics of plating layers to be formed on the respective plating regions.

Moreover, this electroplating method can regulate the distribution of current density in a plating region. This electroplating method uses the anode combined with the shield to narrow the distribution of current density. Thus, it is possible to decrease a thickness distribution of a plating layer and form a plating layer with a uniform composition ratio. Particularly, it is possible to suppress an increase in a composition ratio of nickel forming the plating layer in both ends of the plating layer.

Further, in the electroplating method according to an embodiment of the present disclosure, the spray nozzle is disposed between the anode and the shield. Thus, it is possible to improve the degree of uniformity in the flow velocity of a plating solution between the anode and the substrate which is a plating target object.

The exemplary embodiments of the present disclosure can also be described as follows:

According to an aspect of the present disclosure, there is provided an electroplating apparatus. The electroplating apparatus comprises a plating bath, a stage configured to support a substrate loaded into the plating bath to be disposed in a horizontal direction, a plurality of cathodes disposed on both sides of the substrate, an anode configured to be movable above the substrate, a plurality of spray nozzles disposed on at least one side of the anode and configured to spray a plating solution, and a shield which is disposed on both sides of the anode, one end of the shield is more adjacent to the substrate than the anode.

The shield may be disposed between the anode and the plurality of spray nozzles.

The shield may be spaced apart from outlet openings of the plurality of spray nozzles.

The shield may be in contact with the anode and lateral surfaces of outlet openings of the plurality of spray nozzles.

The plurality of spray nozzles may include a plurality of first spray nozzles disposed on a front surface of the anode and a plurality of second spray nozzles disposed on a rear surface of the anode based on a movement direction of the anode, and the shield may include a first shield disposed between the anode and the plurality of first spray nozzles and a second shield disposed between the anode and the plurality of second spray nozzles.

The plurality of spray nozzles may be disposed between the anode and the shield.

Lateral surfaces of outlet openings of the plurality of spray nozzles may be in contact with the anode and the shield.

The plurality of cathodes may include a plurality of first cathodes on one side of the substrate and a plurality of second cathodes on the other side of the substrate based on a movement direction of the anode, and the plurality of first cathodes may be disposed facing the plurality of second cathodes, respectively.

The electroplating apparatus may further comprise a power supply unit electrically connected to the plurality of cathodes and the anode and configured to apply a current, and a controller configured to control the power supply unit, and the controller may control the power supply unit to apply the same voltage to a first cathode and a second cathode facing each other among the plurality of first cathodes and the plurality of second cathodes.

According to another aspect of the present disclosure, there is provided a horizontal electroplating apparatus. The horizontal electroplating apparatus comprises a plating bath providing a space where a plating solution is filled, a plurality of first cathodes and a plurality of second cathodes disposed to face each other within the plating bath, an anode configured to be movable between the plurality of first cathodes and the plurality of second cathodes, a shield disposed adjacent to the anode and configured to be movable together with the anode, and a spray nozzle disposed between the anode and the shield or outside the shield and configured to be movable together with the anode and the shield.

The spray nozzle and the shield may be disposed to be spaced apart from each other.

The spray nozzle may be in contact with the shield such that the plating solution is sprayed along the shield.

The shield may have a shape protruding more downward towards the plating bath than the anode.

A length of the shield protruding under the anode may be changed to regulate a current density under the anode.

The anode, the shield, and the spray nozzle may be configured to move in a direction perpendicular to a surface of the plating solution to regulate current density under the anode.

According to yet another aspect of the present disclosure, there is provided an electroplating method. The electroplating method comprise placing a substrate including a seed pattern in a horizontal direction within a plating bath, placing a plurality of cathodes on both sides of the substrate, placing an anode combined with a shield and a spray nozzle to be spaced above the substrate, applying a current to the plurality of cathodes and the anode, and depositing a plating layer on the substrate while moving the anode in the horizontal direction.

The shield may be disposed on both sides of the anode and the spray nozzle is disposed on both sides of the shield.

The spray nozzle may be disposed on both sides of the anode and the shield is disposed on both sides of the spray nozzle.

The placing the anode may include placing the shield and the spray nozzle on both sides of the anode, regulating a length of the shield, and regulating a distance between the anode and the substrate.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts substantially equivalent in scope of the present disclosure should be construed as falling within the scope of the present disclosure.

The various embodiments described above can be combined to provide further embodiments. Additional changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroplating apparatus, comprising:
a plating bath having a first side, a second side opposite the first side, and a bottom side extending between the first side and the second side;
one or more stages extending from the first side to the second side of the plating bath, the one or more stages being configured to support a substrate loaded into the plating bath;
a plurality of cathodes disposed on both the first and second sides of the plating bath;
an anode configured to be movable above the plating bath, the anode having a first surface facing the bottom side of the plating bath;
a plurality of spray nozzles disposed on at least one side of the anode and configured to spray a plating solution; and
a shield adjacent to the plurality of spray nozzles being disposed on the at least one side of the anode, the shield having a second surface facing the bottom side of the plating bath,
wherein the second surface of the shield extends further towards the bottom side of the plating bath than the first surface of the anode.

2. The electroplating apparatus according to claim 1, wherein the shield is disposed between the anode and the plurality of spray nozzles.

3. The electroplating apparatus according to claim 2, wherein each of the plurality of spray nozzles has an outlet opening for spraying the plating solution, wherein the shield is spaced apart from the outlet openings of the plurality of spray nozzles.

4. The electroplating apparatus according to claim 3, wherein the shield is in contact with the anode and lateral surfaces of the outlet openings of the plurality of spray nozzles.

5. The electroplating apparatus according to claim 2, wherein the plurality of spray nozzles includes a plurality of first spray nozzles disposed on a first surface of the anode and a plurality of second spray nozzles disposed on a second surface of the anode based on a movement direction of the anode,
wherein the shield includes a first shield disposed between the anode and the plurality of first spray nozzles and a second shield disposed between the anode and the plurality of second spray nozzles, and
wherein the movement direction of the anode includes a direction from the first side of the plating bath to the second side of the plating bath.

6. The electroplating apparatus according to claim 1, wherein the plurality of spray nozzles are disposed between the anode and the shield.

7. The electroplating apparatus according to claim 6, wherein each of the plurality of spray nozzles has an outlet opening for spraying the plating solution, wherein lateral surfaces of the outlet openings of the plurality of spray nozzles are in contact with the anode and the shield.

8. The electroplating apparatus according to claim 1, wherein the plurality of cathodes includes a plurality of first cathodes on the first side of the plating bath and a plurality of second cathodes on the second side of the plating bath based on a movement direction of the anode,
wherein the plurality of first cathodes are disposed facing the plurality of second cathodes, respectively, and
wherein the movement direction of the anode includes a direction from the first side of the plating bath to the second side of the plating bath.

9. The electroplating apparatus according to claim 8, further comprising:
a power supply electrically connected to the plurality of cathodes and the anode; and
a controller configured to control the power supply,
wherein the controller controls the power supply to supply a same voltage to a first cathode and a second cathode facing each other among the plurality of first cathodes and the plurality of second cathodes.

10. The electroplating apparatus according to claim 9, wherein the same voltage applied to the first cathode and a second cathode facing each other is an alternating current voltage, and
the controller further controls the power supply to supply a direct current voltage to the anode.

11. The electroplating apparatus according to claim 9, wherein the controller is configured to regulate a voltage to be applied to the plurality of cathodes or turn on/off the cathodes based on the area of plating on the substrate corresponding to the position of the anode.

12. The electroplating apparatus according to claim 1, wherein a length of the shield and a distance between the anode and the substrate can be regulated.

13. A horizontal electroplating apparatus, comprising:
a plating bath providing a space where a plating solution is filled, the plating bath having a first side, a second side facing the first side, and a bottom side between the first side and the second side;
a plurality of first cathodes and a plurality of second cathodes disposed to face each other within the plating bath;

an anode arranged above the plating bath and configured to be movable between the plurality of first cathodes and the plurality of second cathodes, the anode having a first end facing the bottom side of the plating bath;

a shield disposed adjacent to the anode and configured to be movable together with the anode, the shield having a second end facing the bottom side of the plating bath; and a spray nozzle disposed at least between the anode and the shield or outside the shield, and configured to be movable together with the anode and the shield, wherein the second end of the shield is closer to the bottom side of the plating bath than the first end of the anode.

14. The horizontal electroplating apparatus according to claim 13, wherein the spray nozzle and the shield are disposed to be spaced apart from each other.

15. The horizontal electroplating apparatus according to claim 13, wherein the spray nozzle is in contact with the shield such that the plating solution is sprayed along the shield.

16. The horizontal electroplating apparatus according to claim 13, wherein a length of the shield protruding under the anode is changed to regulate a current density under the anode.

17. The horizontal electroplating apparatus according to claim 13, wherein the anode, the shield, and the spray nozzle are configured to move in a direction perpendicular to a surface of the plating solution to regulate current density under the anode.

18. An electroplating apparatus, comprising:

a plating bath for placing a substrate, the plating bath having a first sidewall, a second sidewall opposite the first sidewall, and a bottom surface between the first sidewall and the second sidewall;

a plurality of cathodes disposed adjacent to opposing first and second sides of the substrate loaded into the plating bath and configured to fix the substrate to be disposed in a horizontal direction;

an anode configured to be movable above the plating bath, the anode having a first end facing the bottom surface of the plating bath;

a plurality of spray nozzles disposed on at least one side of the anode and configured to spray a plating solution to the plating bath; and a shield which is disposed on a first and second side of the anode, the shield having a second end facing the bottom surface of the plating bath, wherein the second end of the shield extends further towards the bottom surface of the plating bath than the first end of the anode.

\* \* \* \* \*